(12) United States Patent
Roqan

(10) Patent No.: US 11,322,661 B2
(45) Date of Patent: May 3, 2022

(54) SPIN-SENSITIVE ULTRAVIOLET LIGHT-BASED DEVICE AND METHOD

(71) Applicants: KING ABDULLAH UNIVERSITY OF SCIENCE AND TECHNOLOGY, Thuwal (SA); KING ABDULAZIZ CITY FOR SCIENCE AND TECHNOLOGY, Riyadh (SA)

(72) Inventor: Iman Salem Roqan, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 99 days.

(21) Appl. No.: 16/880,004

(22) Filed: May 21, 2020

(65) Prior Publication Data

US 2020/0381594 A1    Dec. 3, 2020

Related U.S. Application Data

(60) Provisional application No. 62/854,430, filed on May 30, 2019.

(51) Int. Cl.
*H01L 33/50* (2010.01)
*H01L 33/32* (2010.01)

(52) U.S. Cl.
CPC ............ *H01L 33/502* (2013.01); *H01L 33/32* (2013.01); *H01L 33/505* (2013.01)

(58) Field of Classification Search
CPC ..... H01L 33/502; H01L 33/32; H01L 33/505; H01L 33/0004; H01L 33/18; H01L 33/06; H01L 33/08
See application file for complete search history.

(56) References Cited

U.S. PATENT DOCUMENTS

| 2019/0010395 A1* | 1/2019 | Schmidt ............ C09K 11/7792 |
| 2020/0168822 A1* | 5/2020 | Roqan ................ H01L 51/4233 |

OTHER PUBLICATIONS

Xiaojun Wei, Wei Wang, and Kezheng Chen, ZnO:Er,Yb,Gd Particles Designed for Magnetic-Fluorescent Imaging and Near-Infrared Light Triggered Photodynamic Therapy, J. Phys. Chem. C 2013, 117, 45, 23716-23729 (Year: 2013).*

Yang Liu, Mingming Jiang, Gaohang He, Shunfang Li, Zhenzhong Zhang, Binghui Li, Haifeng Zhao, Chongxin Shan, and Dezhen Shen, Wavelength-Tunable Ultraviolet Electroluminescence from Ga-Doped ZnO Microwires, ACS Appl. Mater. Interfaces 2017, 9, 46, 40743-40751 (Year: 2017).*

(Continued)

*Primary Examiner* — Mark W Tornow
(74) *Attorney, Agent, or Firm* — Patent Portfolio Builders PLLC

(57) ABSTRACT

A spin-sensitive ultraviolet light-based device includes a p-type GaN layer; an n-type Gd doped ZnO nanostructure grown on the GaN layer; a first electrode formed on the GaN layer; and a second electrode formed on the Gd doped ZnO nanostructure. Electrons supplied through the first and second electrodes are spin-polarized by the Gd doped ZnO nanostructure. Polarized ultraviolet light emitted or received by the Gd doped ZnO nanostructure is correlated with the spin-polarized electrons.

20 Claims, 22 Drawing Sheets

(56) References Cited

OTHER PUBLICATIONS

O. Lupan, T. Pauporte, B. Viana, I. M. Tiginyanu, V. V. Ursaki, and R. Cortès, Epitaxial Electrodeposition of ZnO Nanowire Arrays on p-GaN for Efficient UV-Light-Emitting Diode Fabrication, ACS Appl. Mater. Interfaces 2010, 2, 7, 2083-2090 (Year: 2010).*

Geun Chul Park, Soo Min Hwang, Seung Muk Lee, Hydrothermally Grown In-doped ZnO Nanorods on p-GaN Films for Color-tunable Heterojunction Light-emitting-diodes, Scientific Reports vol. 5, Article No. 10410 (2015) (Year: 2015).*

Alvi, N.H., et al., "Fabrication and Comparative Optical Characterization of n-ZnO Nanostructures (Nanowalls, Nanorods, Nanoflowers And Nanotubes)/p-GaN White-Light-Emitting Diodes,". Scripta Materialia, Dec. 2, 1010, vol. 64, pp. 697-700.

Aravindh, S.A., et al., "Ferromagnetism in Gd Doped ZnO Nanowires: A First Principles Study," Journal of Applied Physics, Dec. 19, 2014, vol. 116, pp. 233906-1-233906-5.

Bantounas, I., et al., "Structural and Magnetic Properties of Gd-Doped ZnO," Journal of Materials Chemistry C, Oct. 22, 2014, vol. 2, pp. 10331-13306.

Chambers, S., "Is it Really Intrinsic Ferromagnetism?," Nature Materials, Dec. 2010, vol. 9, pp. 956-957.

Roqan, I.S., et al., "Obtaining Strong Ferromagnetism in Diluted Gd-Doped ZnO Thin Films Through Controlled Gd-Defect Complexes," Journal of Applied Physics, Feb. 19, 2015, vol. 117, pp. 073904-1-073904-6.

Sharma, P., et al., "Ferromagnetism Above Room Temperature in Bulk and Transparent Thin Films of Mn-Doped ZnO," Nature Materials, Oct. 2003, vol. 21, pp. 673-677.

Venkatesh, S., et al., "Defect-Band Mediated Ferromagnetism in Gd-Doped ZnO Thin Films," Journal of Applied Physics, Jan. 7, 2015, vol. 117, pp. 013913-1-013913-5.

* cited by examiner

SPIN-SENSITIVE ULTRAVIOLET LIGHT-BASED DEVICE AND METHOD

CROSS-REFERENCE TO RELATED APPLICATIONS

This application claims priority to U.S. Provisional Patent Application No. 62/854,430, filed on May 30, 2019, entitled "UV AND DEEP UV SPIN EMITTING DEVICES AND PHOTODETECTORS BASED ON WIDE BANDGAP MATERIALS DOPED WITH RARE EARTH AND/OR RARE EARTH MATERIALS," the disclosure of which is incorporated herein by reference in its entirety.

BACKGROUND

Technical Field

Embodiments of the subject matter disclosed herein generally relate to a system and method that encodes information by using electron spin polarization, and more particularly, to a device that generates/detects ultraviolet (UV) and/or deep UV polarized light that is associated to the spin polarization of electrons in the device.

Discussion of the Background

Spintronics is the term adopted in the art for electronic devices that utilize the electron's spin property for information processing, thus benefiting from an additional degree of freedom compared to electronics, where the electrical charge of an electron/hole is the main information carrier. The ability to capture information using both the charge and the spin of the carriers has led to several novel and highly advantageous device functionalities. Essentially, a spintronics device is capable of polarizing electrons with desired spins, into a spin injector region, and generating polarized light into a light emitting material, where the light polarization is associated with the spins of the polarized electrons.

Thus, if the spins of the polarized electrons follow a certain encoding pattern, the polarized light generated by these electrons preserves that information. For example, the electrons can be manipulated to have the spins up or down, which will correspond to the digits one and zero. In this way, information can be encoded at the electron level through their spins, transformed into the polarization of the light, and then transmitted at any desired distance to a receiver. The receiver, similar to the transmitter, would have a region that detects the polarized light, and a region that spin-polarizes electrons having appropriate spins, based on the received polarized light. The electrons that are spin polarized at the receiver match the spins of the electrons used at the transmitter to generate the polarized light. In this way, the electrons with the original spins are recovered at the receiver and the information encoded in their spins can be extracted. An advantage of these devices is the low power usage and the small footprint of the receiver/transmitter, which would allow further miniaturization of the existing electronic devices.

More specifically, in spin-light emitting devices, spin-polarized electrons are injected from a ferromagnetic (FM) layer called "injector" (can be magnetic semiconductor or metal layer) into an active layer (the layer that emits the light, such as quantum well, nanowire, nanotube, quantum dots) in the spin-LED or spin-LD, where radiative recombination of the spin-polarized carriers results in the emission of circularly polarized light. The quantum selection rules relate the circular polarization of the light emitted to the spin polarization of the carriers involved. However, when the FM layer is deposited on the semiconductor (active emitting layer) surface, the interface defects (e.g., large conductivity mismatch, or lattice mismatch) between the FM layer and the semiconductor results in very poor spin injection efficiency from the FM layer into semiconductor, resulting in the emitted light being poorly circularly polarized.

As new generators of electronic devices will likely be developed using spintronics technologies, significant research effort has been dedicated to wide bandgap-diluted magnetic semiconductors (WBG-DMSs), doped ZnO in particular [1,2]. In the search for room temperature ferromagnetism (RTFM) in ZnO, rare earth (RE) dopants have emerged as promising candidates and have been the subject of intense investigations. Doping ZnO with gadolinium (Gd)—one of the RE elements—should produce stronger ferromagnetism compared with that obtained when ZnO is doped with transition metals due to partially filled 4f sublevel. Gd possesses seven spin-up electrons in partially filled 4f sublevel and one electron in 5d sublevel that are buried deep below fully filled 6s and 5p sublevels. The interesting magnetic properties of Gd elements arise from the 4f electrons.

Thus, defect complex with Gd were found to be responsible for the RTFM in ZnO. Irrespective of the strong localization of the 4f sublevels in the RE elements, f-s and f-d magnetic coupling is expected to give rise to strong defect-mediated ferromagnetism in such systems. The ferromagnetism in ZnO has been attributed to defect-induced or defect-mediated magnetism that is produced at high Curie temperatures (>350 K, i.e., above the thermal temperature at RT) compared to that of a metal, indicating that the observed ferromagnetism remains stable at high temperature. This characteristic is very promising for spintronic applications.

Furthermore, based on a density functional theory (DFT) study of RE-doped ZnO, ferromagnetic coupling was reported when the RE atoms were in nearest neighbor positions [3, 4]. On the other hand, research on Gd-doped ZnO revealed that ferromagnetic coupling depends on the crystal structure and positions of the dopant atoms in the host matrix, as well as the distance between the RE dopants [5, 6].

Spin-light emitting diode (spin-LED) and spin-laser diode (spin-LD) are among the most promising spintronic applications, as the functionality of these structures is based on a combination of a spin injector and an emission of a circularly polarized light. Thus, development of such devices can lead to significant advances in several fields, such as quantum information storage and transmission, coding, circular dichroism spectroscopy, ultrafast magnetic chiral synthesis in biological applications, data transfer in the form of coded light signal, all-optical magnetic writing, three-dimensional displays, and quantum optical communications. Their contribution may be particularly relevant to space and solar blind applications, as it avoids visible (solar light) interference that hinders device performance in civil aviation and military applications.

However, the existing devices are either expensive, difficult to be manufactured, or not efficient. In addition, due to the interface defects between the injector region and the light emitting region, very poor spin injection efficiency is achieved, which results in the emitted light being poorly circularly polarized. Thus, there is a need of a new material to be used in the spin-LED and/or spin-LD that avoids these deficiencies of the existing devices.

BRIEF SUMMARY OF THE INVENTION

According to an embodiment, there is a spin-sensitive ultraviolet light-based device that includes a p-type GaN layer, an n-type Gd doped ZnO nanostructure grown on the GaN layer, a first electrode formed on the GaN layer, and a second electrode formed on the Gd doped ZnO nanostructure. Electrons supplied through the first and second electrodes are spin-polarized by the Gd doped ZnO nanostructure. Polarized ultraviolet light emitted or received by the Gd doped ZnO nanostructure is correlated with the spin-polarized electrons.

According to another embodiment, there is a spin-sensitive ultraviolet light-based device that includes a p-type layer, an n-type rare element doped ZnO nanostructure grown on the p-type layer, a first electrode formed on the p-type layer, and a second electrode formed on the rare element doped ZnO nanostructure. Electrons supplied through the first and second electrodes are spin-polarized by the rare element doped ZnO nanostructure. Polarized ultraviolet light emitted or received by the rare earth doped ZnO nanostructure is correlated with the spin-polarized electrons.

According to yet another embodiment, there is a method for encoding/decoding information based on a spin of an electron. The method includes providing an electrical current to a spin-sensitive ultraviolet light-based device, spin-polarizing electrons, based on the information, with an n-type Gd doped ZnO nanostructure grown on a GaN layer (222) in the spin-sensitive ultraviolet light-based device, generating polarized ultraviolet light in the n-type Gd doped ZnO nanostructure, based on the spin-polarized electrons, and sending, in a wireless manner, the polarized ultraviolet light containing the information.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
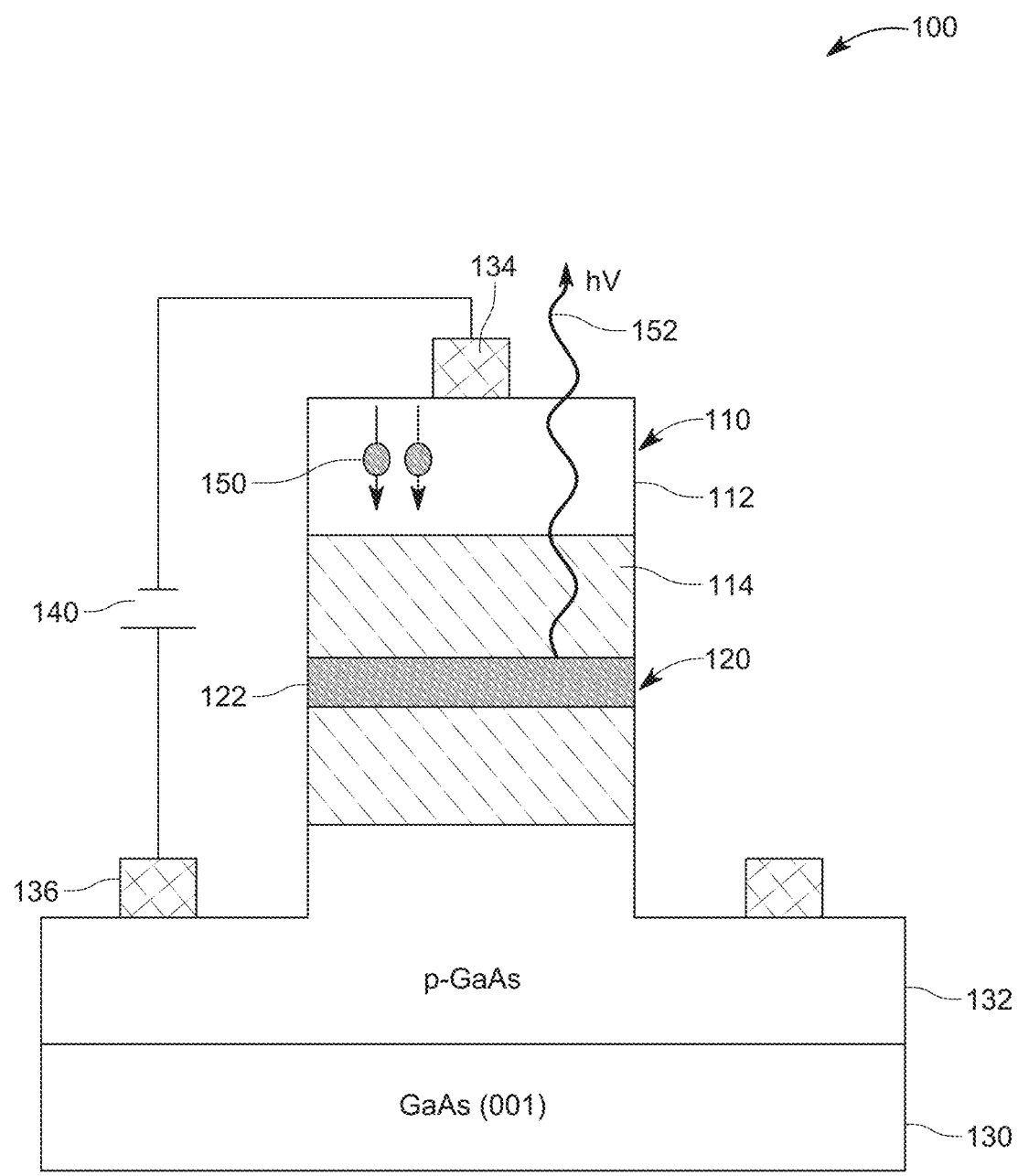
FIG. 1 is a schematic diagram of a device having a spin injector implemented in a first layer and a light generator implemented in a second layer.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to an n-type Gd doped ZnO nanotubes (NTs) grown on a p-type GaN layer. However, the embodiments to be discussed next are not limited to NT, but may be implemented into other nanostructures.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a novel UV light based transmitter/receiver device is disclosed and this device is capable of modulating the generated UV light based on the spin of an electron that is injected into the device, or may receive polarized UV light and can spin polarize electrons (or holes) in the device based on the polarized UV light. The device may be a spin-LED or spin-LD. The device includes a nanostructure that simultaneously acts as a spin injector and a light generator. The spin injector functionality of the nanostructure is configured to control a spin of the electrons that are used to generate the UV light with the light generator functionality. The light generator is configured to generate polarized light, that is correlated with the spin of the injected electrons. The layer that hosts the spin injector and the light generator functionalities includes a wide bandgap-diluted magnetic semiconductor (WBG-DMS). The WBG-DMS is doped with a rare earth element or a rare earth including material for achieving room temperature ferromagnetism. In one application, the rare earth element is Gd (gadolinium) and the WBG-DMS includes nanowires or nanorods or nanotubes made of ZnO. However, other materials may be used.

In the following, the UV light is understood to include any wavelength between 100 and 400 nm, with UV-A including wavelengths between 400 and 315 nm, UV-B including wavelengths between 315 and 280 nm, and UV-C or deep UV including wavelengths between 280 and 100 nm.

Prior to discussing the novel UV-based spintronics devices developed by the inventors, some shortcomings of the existing UV systems are discussed. UV light emitting diodes (LEDs) have a wide range of applications, including solid-state lighting, photo-electrochemical hydrogen generator, photo-polymerization, sterilization, environmental sensing, and treatment for a variety of diseases, including skin disorders and cancer. However, current UV-A LEDs (operating in the 320-370 nm range) based on GaN/AlGaN multiple quantum wells (MQWs) suffer from many issues, one of which is the extremely low external efficiency (<10%) when compared to the visible LEDs due to threading dislocations (TDs) stemming from the large lattice mismatch between the substrate and GaN materials. A high density of TDs is responsible for generating abundant nonradiative centers.

Moreover, the efficiency droop in the existing UV LEDs, when a high carrier density is injected optically is well documented, which further limits their performance. Furthermore, at present, no cost-effective UV LED is available due to highly expensive nitride materials and the associated fabrication processes. Thus, it is practically impossible to produce such materials on a large scale at a reasonable cost. Consequently, obtaining high-efficiency UV-A LEDs remains a significant challenge.

The ZnO material is a good candidate for the UV LEDs due to its wide and direct bandgap, as well as a greater exciton binding energy (60 meV) than GaN, allowing the exciton remained not dissociated by the thermal effect (phonons). In particular, the high-quality one-dimensional (1D) ZnO nanostructures such as nanorods (NRs), nanowires (NWs), and nanotubes (NTs) are the best candidates for UV light emitting devices and lasers, as well as other applications, such as photodetectors. 1D ZnO layers are the alternative material for UV emitting devices, as they can be formed more easily compared to the 1D GaN nanostructures and addressing all aforementioned issues related to the UV devices. In addition, the 1D ZnO structures possess unique optical and electrical properties due to their high aspect ratio and related quantum confinement effect, high crystalline quality, and simple fabrication methods. Furthermore, a lattice-matched substrate is not required for forming a high-quality and dislocation-free 1D ZnO nanostructure.

Moreover, the 1D ZnO is a promising self-powered nanogenerator material for converting mechanical energy into electric power, which can be a highly valuable property for self-powered UV LEDs. Thus, ZnO 1D structures can result in more cost-effective and more efficient emitting devices. However, most of the previous work that has been conducted on LEDs based on ZnO films and nanostructures did not show high efficiency devices. Such poor efficiency is due to low ZnO film quality or ZnO microstructure without confinement effect, or 1D ZnO nanostructures synthesized via metal seeding, resulting in low device performance.

In this regard, it is known that metal seeding introduces metal contamination that absorbs UV emission, resulting in inefficient UV emission. Thus, the desired high optical and structural 1D material quality must be achieved without utilizing metal catalyst or seeding, which is preferred for all UV optoelectronic devices, not only LEDs. Thus, producing droop-free, high-efficiency, and cost-effective UV LEDs—in particular, those based on high-performance metal catalyst-free 1D n-ZnO/p-GaN structure—is extremely challenging, which is why such devices have not yet been obtained.

The spin injector and the light generator functionalities of a spin-LED are briefly discussed with regard to FIG. 1. A spin-LED 100 includes a spin injector region 110 and a light generator region 120. The spin injector region 110 includes a ZnMnSe layer 112 and an AlGaAs layer 114 formed next to each other while the light generator region 120 includes quantum wells (QW) formed in a layer 122 of GaAs. The device further includes a GaAs substrate 130, a p-type GaAs layer 132, and first and second electrodes 134 and 136 connected to a power source 140.

Efficient injection of spin-polarized electrons from a ferromagnetic (FM) source (layer) into a semiconducting heterostructure is a prerequisite for the realization of spintronic devices including spin-emitting devices (such as spin-LED and spin-LD) as well as spin-photodetectors. In the spin LED or spin-LD device 100, the spin information of the injected electrons 150 can be converted into circular polarization information carried by the emitted photons 152. This results in an emission of right- or left-circularly polarized photons depending on the electrons' spin orientation. In other words, in one embodiment, the information to be transmitted is mapped to the spin up or down of the electrons, and these spins are then translated into right- or left-circularly polarized photons, at the transmitter side. At the receiver side, the process is reversed, i.e., the right- or left-circularly polarized photons are "translated" into spin up or down electrons, and then the spins are "read" as zeros and ones to regenerate the original information.

In this case, the spin-polarized electrons 150 are injected across the ZnMnSe/AlGaAs interface into the GaAs quantum well. Radiative recombination in the QWs results in circularly polarized light emission 152.

In the following, various new devices that overcome these problems are discussed. These devices share a novel feature of having the spin injector region and the light generator region hosted by the same layer, so that there is no physical interface between the two regions, which avoids the defect presence between these two regions. In one application, the spin injector region and the light generator region are intertwined into a single layer such that there is no physical boundary between the two regions. In this regard, note that the device 100 of FIG. 1 has a clear boundary between the spin injector region 110 and the light generator region 120. That boundary is non existing for the present devices.

Thus, in one embodiment, a novel spin-LED 200 includes a nanosized, intertwined spin injector region/light generator region 210 formed on a p-type layer 220. The intertwined spin injector/light generator layer 210 works at the same time as the active layer, which emits the polarized light, and as the spin injector, which spin-polarizes the electrons. In this way, the intertwined spin injector/light generator layer 210 overcomes the issue of spin injection limitation from the FM layer into the light generator layer, which is typical for the existing spin-LED or spin-LD devices. In other words, the active layer is also the spin injector in this embodiment, and this configuration is achieved by the choice of materials used to spin polarize the electrons at room temperature, without an applied magnetic field. A thickness of the intertwined spin injector region/light generator region 210 is less than 200 nm.

A first electrode 230 is formed on the intertwined spin injector/light generator layer 210 and a second electrode 238 is formed on the p-type layer 220. The first electrode may include a first layer 232 of Ni and a second layer 234 of Au while the second electrode may include a first layer 236 of Ti and a second layer of 234 of Au. More or less layers may be included in each electrode. Other materials may be used for the first and second electrodes. The first and second electrodes are deposited, for example, by sputtering, to allow as much light emission as possible from the intertwined spin injector/light generator layer 210.

The p-type layer 220 may include a GaN layer 222, which is known to be a semiconductor. The p-type layer 220, together with the intertwined spin injector/light generator layer 210, which is a n-type layer, form a p-n junction. In one application, the p-type GaN layer may be doped with Mg atoms. Other semiconductor materials may be used. The intertwined spin injector/light generator layer 210 may include an n-type Gd-doped ZnO nanolayer. The intertwined spin injector/light generator layer 210 is configured to spin-polarize electrons 212 received from an external power source 240. The spin of the electrons 212 can be controlled with a voltage V applied by the power source 240. The power source 240 may be controlled with a computing device 250 so that electrons with spin up or spin down can be generated as desired.

In general, the device 200 can be any n-type WBG-DMS on p-type semiconductors or n-type semiconductors on p-type WBG-DMS to produce polarized UV emission from ferromagnetic materials. The intertwined spin injector/light generator layer 210 is also configured to emit polarized UV light 224 due to the interaction with the spin-polarized electrons 212.

The intertwined spin injector/light generator layer 210 of the spin-LED device 200 may be implemented in any optoelectronic device. The term "optoelectronic device" is used herein to refer to any one or more of: a photovoltaic device, such as a photodiode, a solar cell, an array of solar cells, or a solar panel; a photodetector device, such as a photodetector, an image sensor, an array of photodetectors, or a photodetector panel; a light emitting device, such as a light emitting diode (LED), an array of LEDs, an LED panel, or an LED display; a sensing device, such as one or more sensors; any other device equipped with at least one of the materials, structures, or layers described herein; any device configured to function as any of the foregoing devices, or any combination thereof. In one example, an optoelectronic device may include a receiver or a transmitter. In another example, an optoelectronic device may be a transceiver. In another example, an optoelectronic device may include one or more highly sensitive photodetectors. In another example, an optoelectronic device may function both a solar cell and a photodetector. In yet another example, an optoelectronic device may include one or more LEDs.

Figure 2:
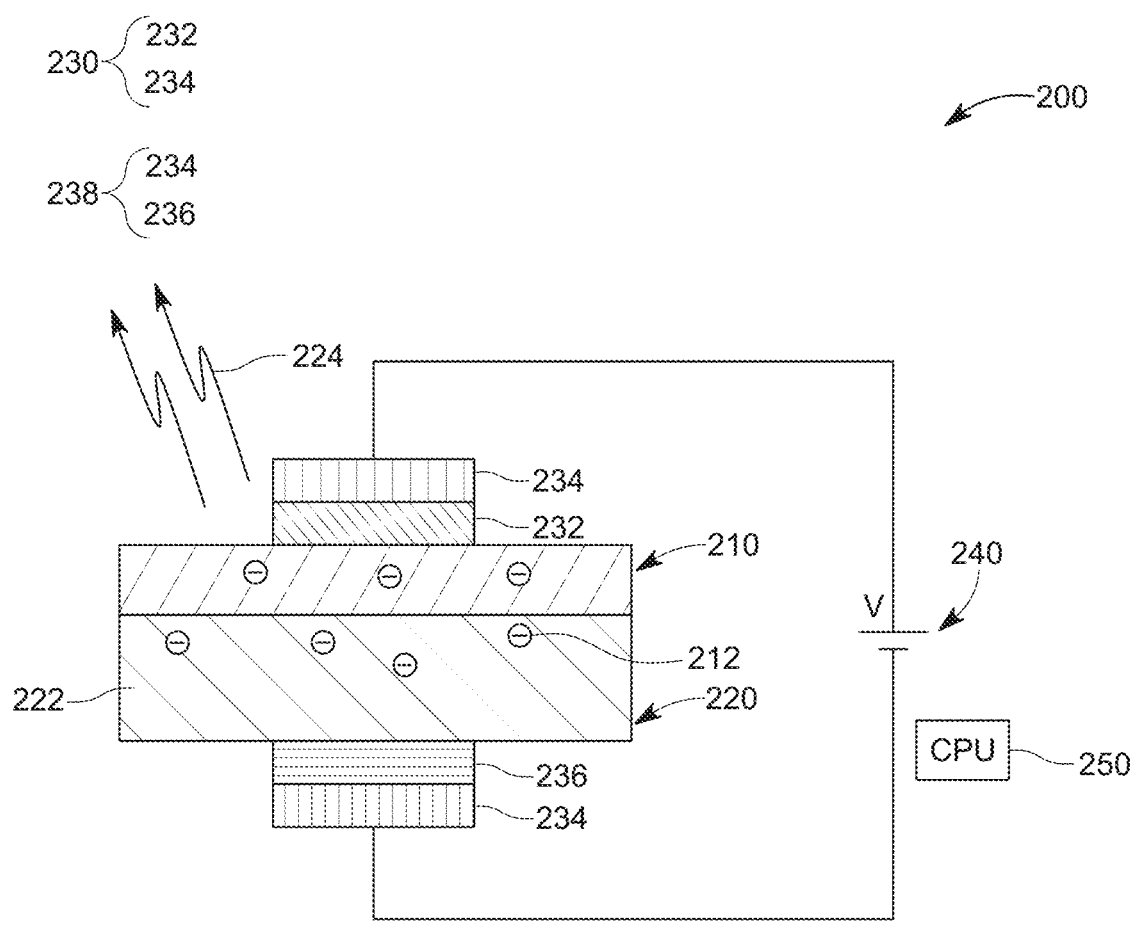
FIG. 2 is a schematic diagram of a device having the spin injector and the light generator implemented in a same layer.
Figure 3:
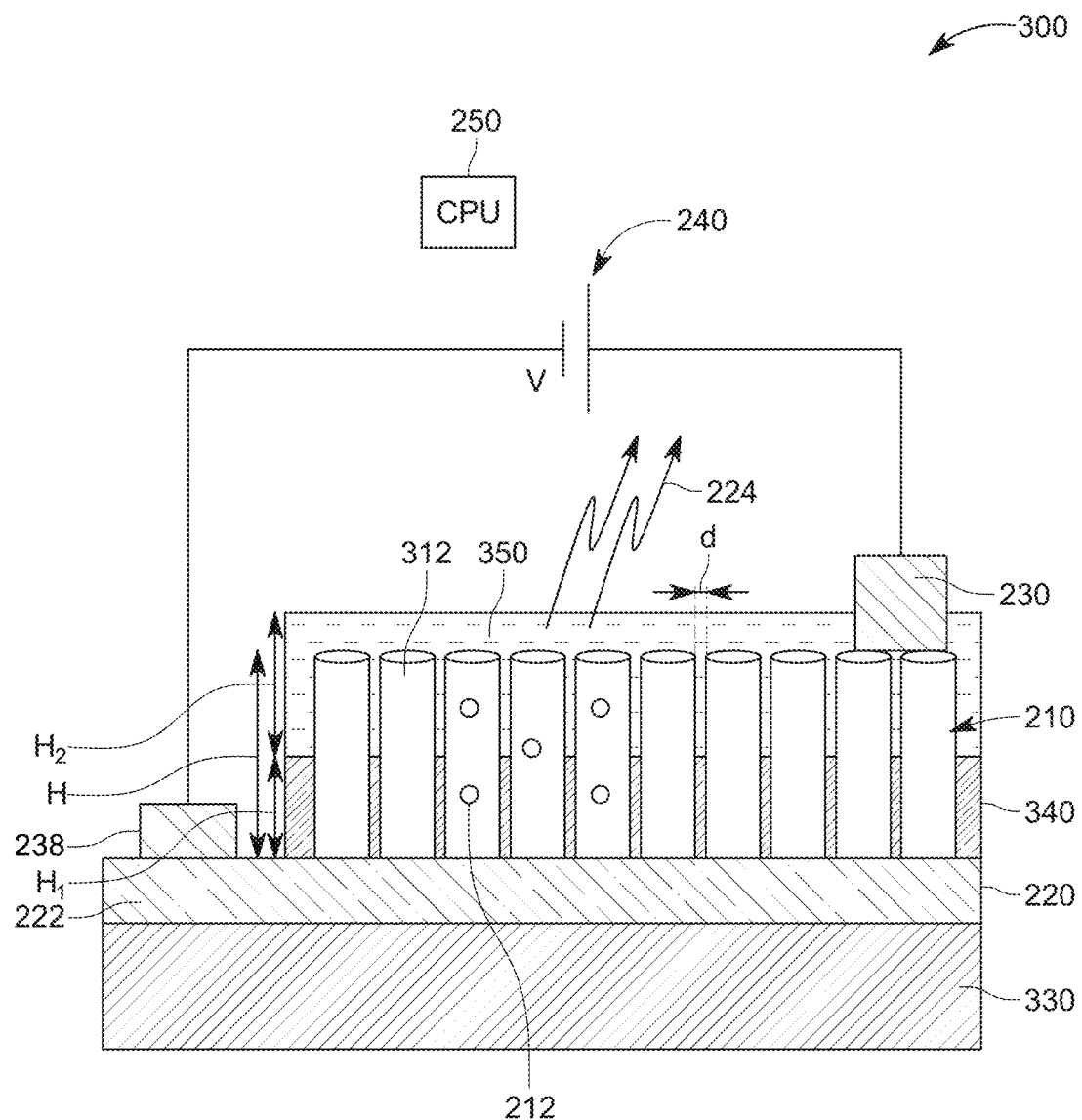
FIG. 3 is a schematic diagram of another device having the spin injector and the light generator implemented in a same layer.

FIG. 3 shows another embodiment in which an intertwined spin injector/light generator material is used for obtaining an optoelectronic device. The spin-LED 300 in FIG. 3 is different from the spin-LED 200 in FIG. 2 in terms of the geometry of the intertwined spin injector/light generator material. In this respect, FIG. 3 shows that the intertwined spin injector/light generator material is implemented not as a nano-thick layer, but as a nanostructure 312, i.e., plural nanorods or nanotubes or nanowires or a combination of them. In one application, these nanostructures extend along a line perpendicular to the surface of the p-type layer 220. FIG. 3 shows that the nanotubes 312 (the same is true if nanorods or nanowires are used) are separated from each other by a distance d, which is smaller than 100 nm. The nanotubes 312 are made in one embodiment of Gd doped ZnO. The nanotubes 312 are grown directly on the p-type layer 220, which may include a p-type GaN layer 222.

FIG. 3 further shows that the p-type GaN layer 322 is formed on a substrate 330, which may be sapphire or silicon covered by a layer of $Al_2O_3$. After the nanotubes 312 were formed on the p-type GaN layer 222, a layer 340 of a transparent thermoplastic material, for example, Poly(m-ethyl methacrylate), PMMA, is spun over the p-type GaN layer 222, so that the layer 340 partially covers the lower parts of the nanotubes 312. FIG. 3 shows that the lower portion of the nanotubes 312 is completely enclosed by the PMMA layer 340 while the top portion of the nanotubes are not enclosed by the PMMA layer 340. In other words, if the height of the nanotubes 312 is H, when measured from the surface of the GaN layer 222, the height H1 of the PMMA layer 340, when measured from the same surface of the GaN layer 222, is smaller than H. The top portion of the nanotubes 312 is partially or fully encapsulated by a transparent conductor, for example, an indium-tin-oxide (ITO) layer 350, which is formed directly over the PMMA layer 340. The height H2 of the ITO layer 350 is selected so that H1+H2>H.

The first electrode 230 is formed on the ITO layer 350, to directly contact the tips of some of the nanotubes 312, while the second electrode 238 is formed on the GaN layer 222, as also shown in FIG. 3. A power source 240, that generates a voltage V, is connected to the first and second electrodes to provide electrons. A computing system 250 controls the power source 240 so that information (for example, zeros and ones) can be encoded into the electrical current generated by the power source 240 or can be decoded from an electrical current that is modulated by the intertwined spin injector/light generator material when receiving polarized light.

The intertwined spin injector/light generator nanotubes 312 are configured to generate polarized light 224 based on the received spin-polarized electrons 212, and thus effectively transmit the information embedded by the spin arrangement of the electrons, or to receive polarized light and spin-polarize the electrons so that the computing device 250 can then decode the information carried by the polarized light by analyzing the spin pattern of the spin-modulated electrons 212.

In other words, the devices 200 and 300 discussed herein can act as light generators (transmitter) or light receivers (receivers) for transmitting information. Those skilled in the art would understand that these devices may be used for other purposes as well, as already discussed above. In one embodiment, as noted in FIG. 3, the emitted or received polarized light 224 moves through the transparent thermoplastic layer 340 and the transparent conductive layer 350 before entering the Gd doped ZnO nanostructure 312 or after being generated by the Gd doped ZnO nanostructure 312.

Figure 4A:
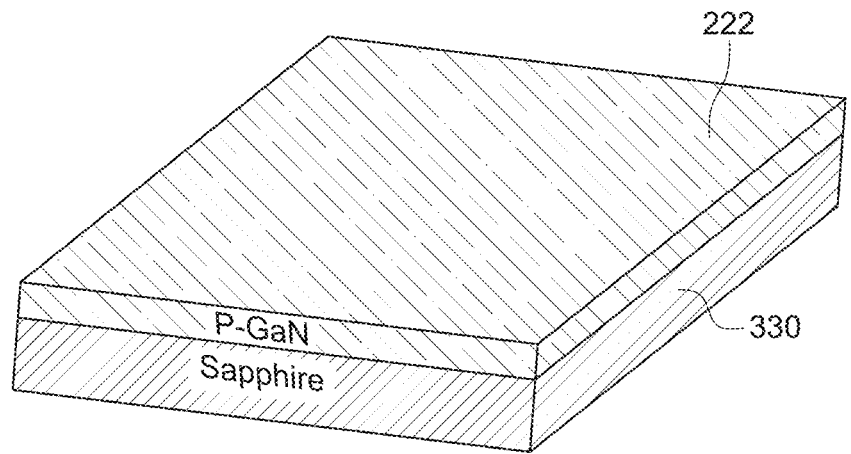
FIGS. 4A to 4E illustrate a method of forming a device having the spin injector and the light generator implemented in plural nanotubes.
Figure 4B:
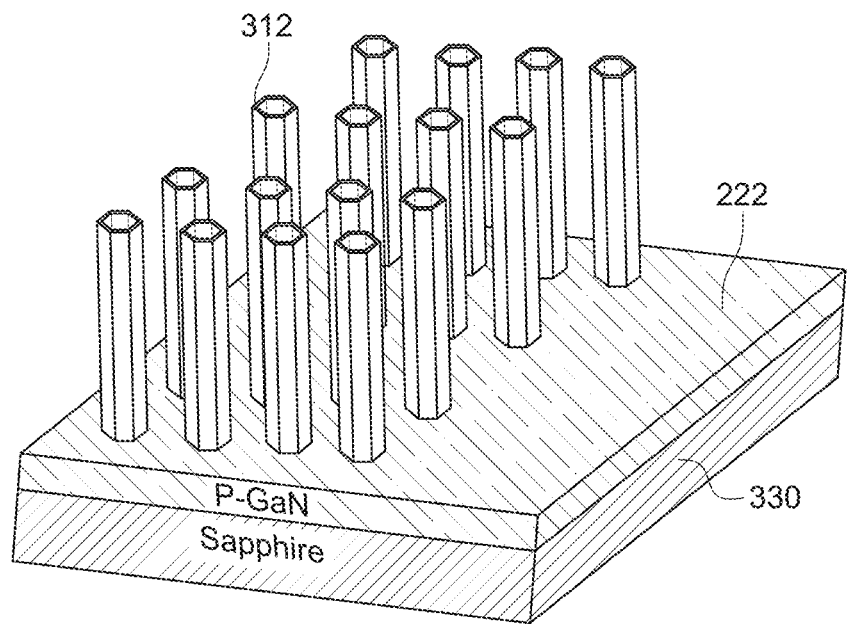
Figure 4C:
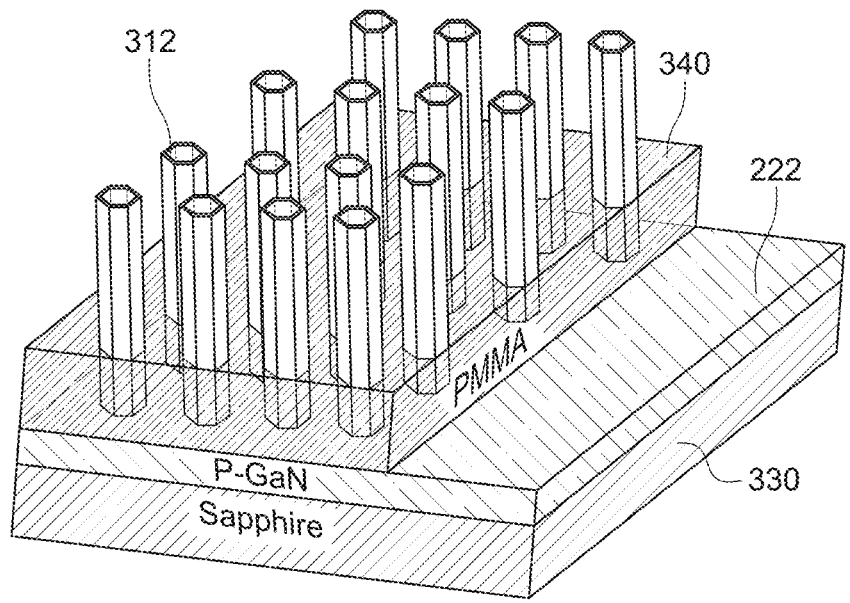
Figure 4D:
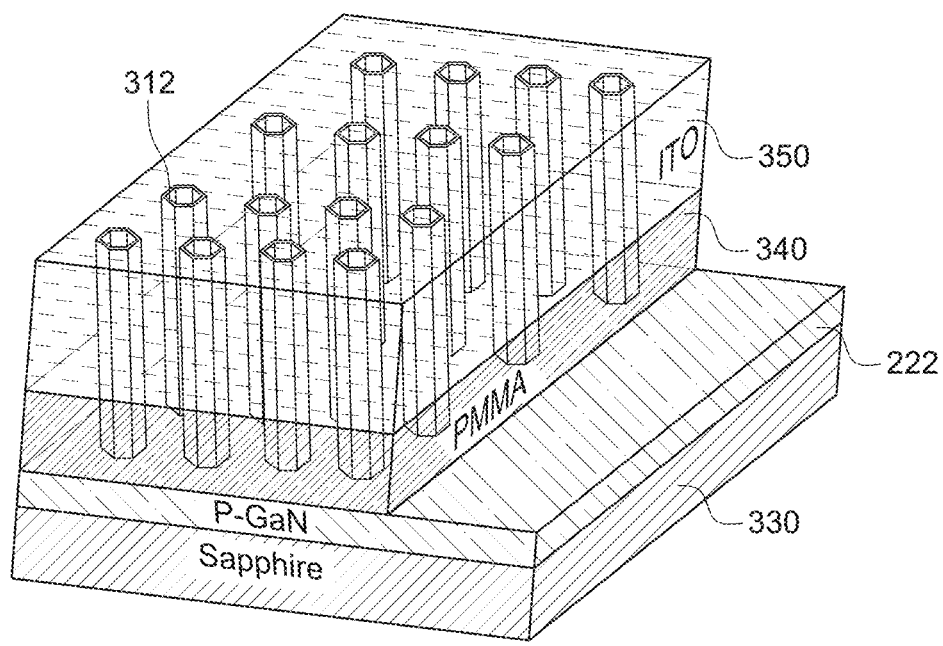
Figure 4E:
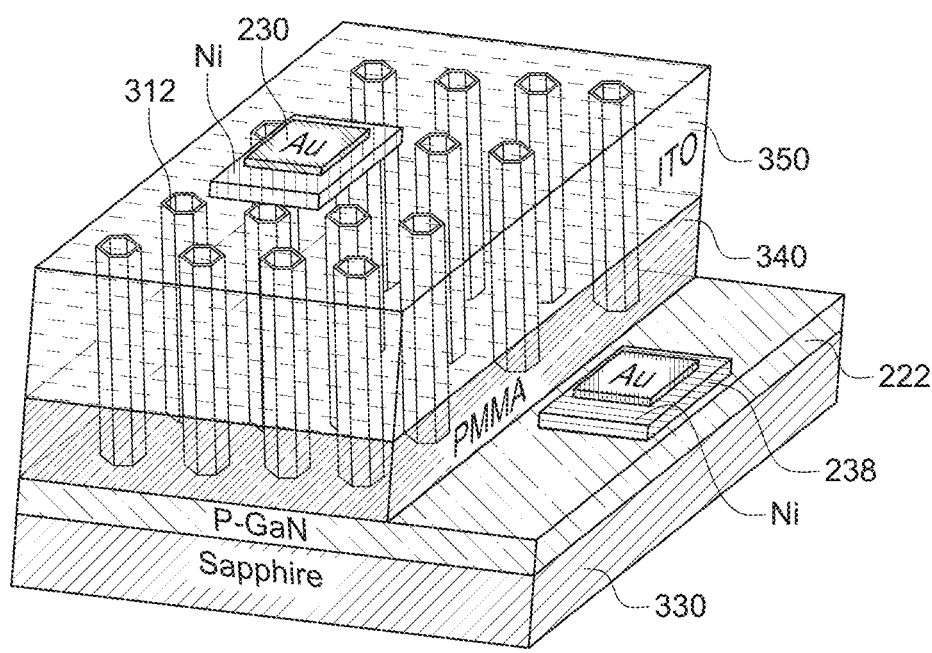

A method for making the intertwined spin injector/light generator layer 210 or intertwined spin injector/light generator nanostructure 312 is now discussed. In the following, the term "intertwined spin injector/light generator material" is used to generically refer to the layer 210 or nanorods and/or nanorods and/or nanotubes 312. The spin-LED device 300 is made using vertically aligned Gd-doped ZnO NT arrays as an active region, which were deposited on commercial, high-quality, p-type (0001) GaN epilayers grown on the c-plane (0001) sapphire by pulse laser deposition (PLD) without a catalyst or pre-prepared textured layer, as illustrated in FIGS. 4A to 4E In one application, as illustrated in FIG. 4A, the p-GaN layer 222 of 0.5 μm thickness (with the Mg dopant concentration of about $1\times10^{20}$ cm$^{-3}$) was grown by metalorganic chemical vapor deposition (MOCVD) on the sapphire substrate 330. A Gd-doped ZnO laser ablation target was prepared by mixing 99.75 wt % pure ZnO (99.99%) powder with 2 wt % Gd$_2$O$_3$ (99.99%) powder. A pellet of 2.5 cm diameter was pressed and sintered at ~1100° C. for 12 h to produce a dense disk of 2.3 cm diameter. To grow the ZnO NTs, a Gd 2 wt %-doped ZnO target was used for PLD deposition. A PLD system equipped with a krypton fluoride (KrF) excimer laser (λ=248 nm) was used to ablate the Gd (2 wt %)-doped ZnO target. The p-type GaN substrate was mounted at a large distance (~9 cm) vertically above the target, and the vacuum chamber was pumped to $10^{-6}$ Torr before target ablation. Next, the growth temperature was set to 660° C. The ZnO NTs 312 were grown on the p-type GaN substrate 222, as shown in FIG. 4B, by focusing the laser beam of 5±0.5 J/cm$^2$ fluence (350 mJ) on the Gd-doped ZnO target surface. The deposition consisted, in one embodiment, of 30,000 laser pulses delivered at 10 Hz frequency and oxygen partial pressure of 150 mTorr. The PMMA layer 340 thickness (~200 nm) was optimized by adjusting the spin speed (3,500 rpm) for 45 s, bake temperature (180° C.), and baking time (60 s), as illustrated in FIG. 4C. For current spreading, a 100 nm indium-tin-oxide (ITO) film 350 was subsequently deposited on the NTs 312 by radiofrequency (RF) magnetron sputtering as illustrated in FIG. 4D. Finally, Ni/Au and Ti/Au contacts 230 and 238 were thermally evaporated onto the p-GaN substrate 222 and the exposed ZnO NT tips 312, respectively, as shown in FIG. 4E.

The intertwined spin injector/light generator material was analyzed for confirming its capacity of acting simultaneously as a spin injector and light generator with high efficiency. Scanning electron microscopy (SEM) and X-ray powder diffraction (XRD) measurements with CuKα at λ=1.5406 Å were conducted to study the material structural properties. Transition electron microscope (TEM) lamella was prepared by focused ion beam. Electron energy-loss spectroscopy (EELS) maps were generated by high resolution transmission electron microscopy (HR-TEM) system to confirm the material composition. The current-voltage (I-V) and electroluminescence (EL) signals were also measured and the current was injected by a source operating in continuous mode under different injection currents at room temperature (RT). Temperature-dependent photoluminescence (TDPL) measurements were also performed to investigate the luminescence properties of the Gd-doped n-ZnO NTs and p-GaN film hybrid heterojunction LED device using a 325 nm continuous-wave (CW) He—Cd laser in the 6-300 K temperature range. The excitation laser power was measured at ~25 mW, while the laser beam diameter was maintained at 100 μm. The spectra were collected by a monochromator attached to a charge-coupled device camera. Power-dependent PL (PDPL) and time-resolved PL (TRPL) experiments were conducted using second harmonic (λ=400 nm) pulses of a mode-locked Ti:sapphire femtosecond ultrafast laser (the frequency of which was doubled using a barium borate crystal) with a pulse width of ~190 fs. The pulse power density was 70 kW/cm$^2$ with a 76 MHz repetition rate. A Coherent solid-state CW laser was used to pump the Ti:sapphire laser. In both experiments, the sample emission was detected by a spectrograph attached to a UV-sensitive streak camera with a temporal resolution of 2 ps. The samples were mounted on a closed-cycle helium cryostat for all optical measurements. The results of these measurements are discussed next.

Pre-growth textured layers were found unsuitable for producing well-controlled vertical ZnO nanowires. Furthermore, metal catalysts should be avoided in optoelectronic applications due to metal contamination and lack of transparency that significantly reduces UV device performance. This choice is deliberate, as the metal catalyst reduces the UV emission significantly and may absorb such emission completely. Thus, to address this severe issue, in the method illustrated in FIGS. 4A to 4E, high quality 1D vertical NTs were grown without any metal catalyst.

Figure 5A:
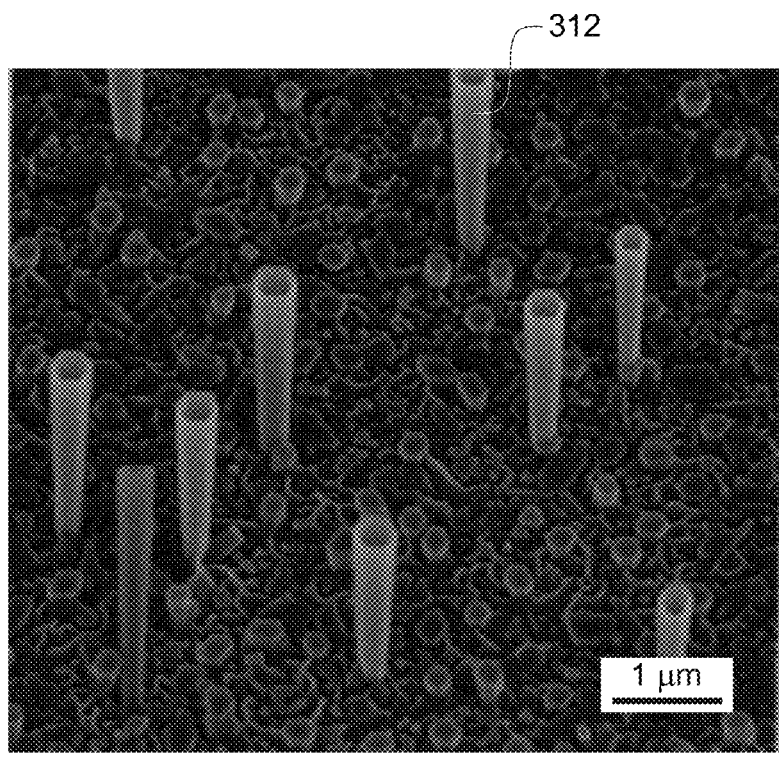
FIGS. 5A to 5C illustrate the nanotubes of a spin sensitive ultraviolet light device.
Figure 5B:
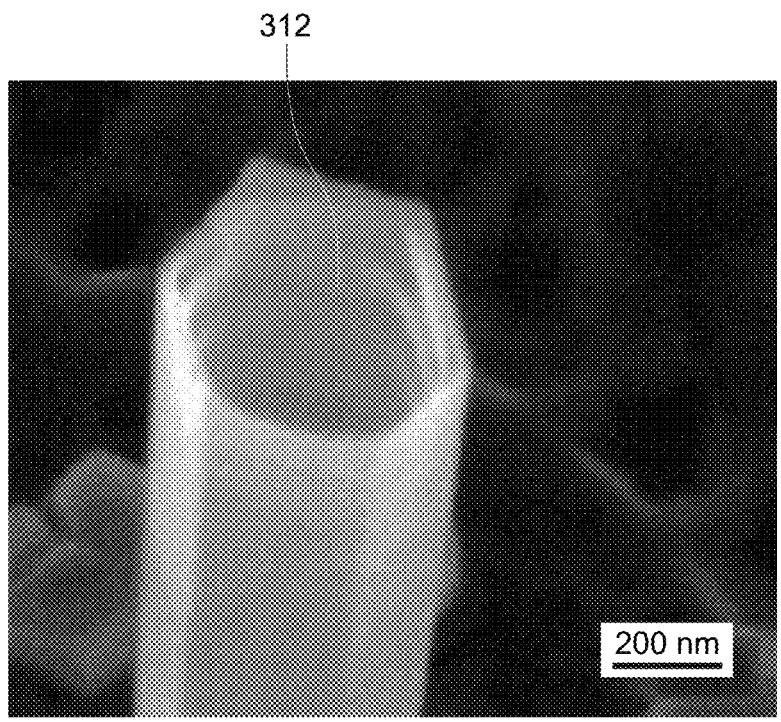
Figure 5C:
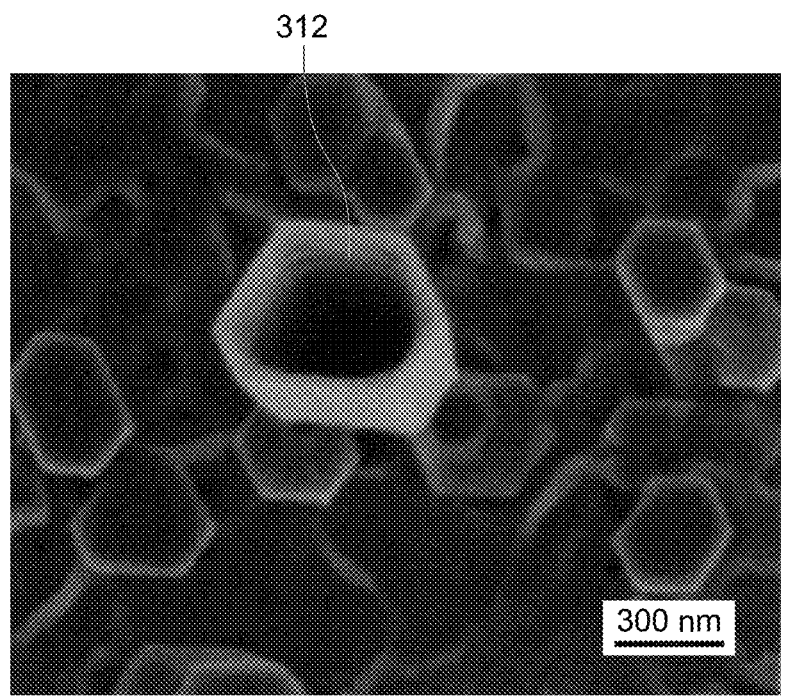

FIGS. 5A to 5C show SEM images of the high-quality NTs 312 of hexagonal shape (see especially FIGS. 5B and 5C) and a vertically well-aligned Gd-doped ZnO NT array (see FIG. 5A) grown on the p-GaN layer 222 that was achieved at the lowest laser energy of 350 mJ (5±0.5 J/cm$^2$ fluence). All deposition parameters were optimized to form these ZnO NTs 312, including the substrate temperature, oxygen pressure, laser fluence, and the number of laser pulses. The inventors have found that 660° C., 30,000 pulses and 150 mTorr were the optimal growth temperature, number of pulses, and oxygen pressure, respectively, for forming the Gd-doped ZnO NTs 312. Systematic growth at different laser energies, ranging from 350 mJ to 550 mJ, was also performed, aiming to optimize the Gd-doped ZnO NT growth on the p-GaN layers. FIGS. 5B and 5C show that the vertical NTs 312 have a length of about 670 nm and a diameter of about 180-200 nm, while the nano-wall has a thickness of about 8-11 nm. The average density of the Gd-doped ZnO NTs 312 was calculated to be at about $1\times10^8$ nanotubes/cm$^2$. The low NT density is due to the use of PLD without a metal catalyst or seeding.

Figure 6A:
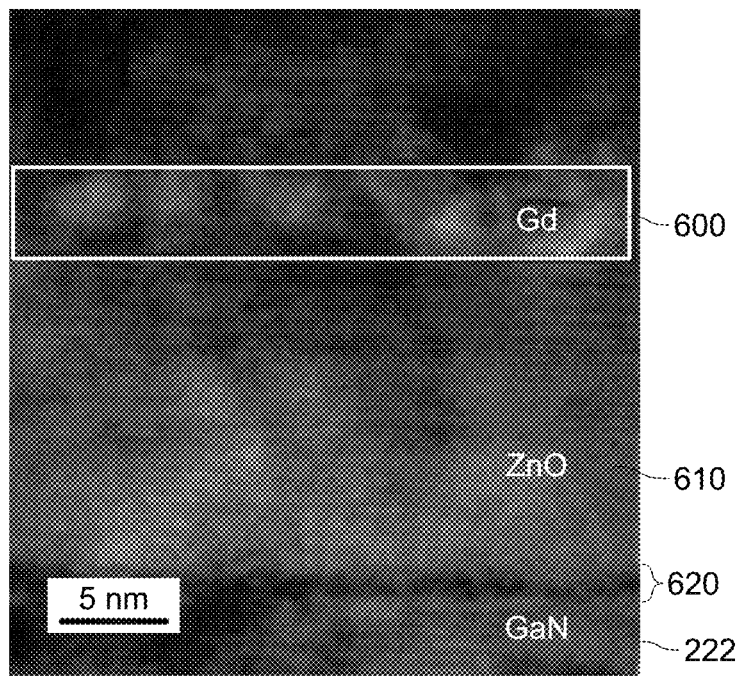
FIGS. 6A and 6B show cross-sections through the nanotubes of the spin sensitive ultraviolet light device.
Figure 6B:
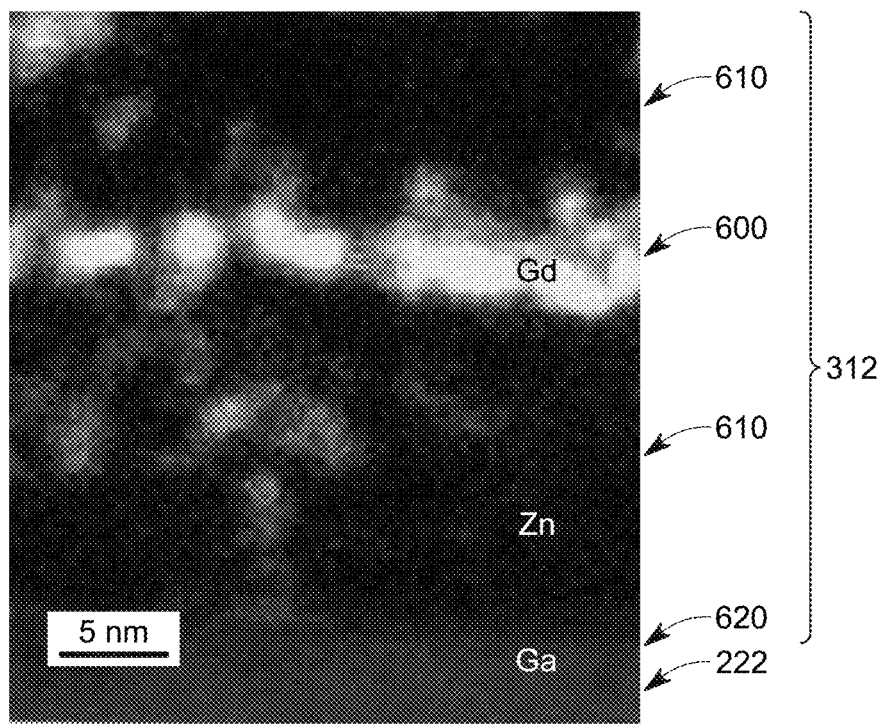

To understand the NT 312 formation mechanism, the inventors have carried out HR-TEM. The scanning transmission electron microscope (STEM) image in FIG. 6A indicates that an in-situ interface Gd nano-layer 600 is formed during PLD growth inside the ZnO material 610, whereby another ultrathin in-situ interface nano-layer 620 is created between the ZnO material 610 and the GaN layer 222 during the growth process. FIG. 6B shows this structure using EELS compositional maps of the cross-sectional image of the Gd-doped ZnO wetting layer on the p-GaN layer. These two in-situ layers 600 and 620 (interface nano-layer and Gd layer) are responsible for vertical NTs formation, which is the optimal choice for growing well-aligned vertical ZnO NTs for potential optoelectronic applications, as the Gd layer does not absorb UV emission given that its first excitation state (~3.9 eV) is far above the bandgap of both the GaN and ZnO (~3.5 eV). Such Gd nanolayer formed during the growth can be due to the low rare earth solubility in ZnO, and because the Gd dopants tend to defuse to the surface or the interface of materials, forming the in situ Gd nanolayer 620 and acting as a textured layer to assist in forming the NTs. This nano-interlayer results in Stranski-Krastanov (SK) nucleation necessary for initiating 1D growth.

In addition, the inventors believe that the in-situ Gd nano-layer 620, formed during the PLD growth between the p-type GaN layer 222 (free of ferromagnetic materials) and the n-type Gd doped ZnO NTs 312 (that include ferromagnetic materials) act as an additional spin injector region.

The other factor affecting the NTs 312 formation is the laser fluence, as the laser fluence determines the nanostructure type (such as NR, NT or quantum dots) formed on a p-GaN substrate using the PLD method due to the changes in the kinetic energy of the charged species upon arrival at the substrate surface. Thus, a slightly lower PLD laser fluence compared to that used for the Gd-doped ZnO nanorods, leads to NT formation. Such power reduction leads to a change in the surface energy from that of the nanorod structure to that of NTs. Secondary ion mass spectrometry (SIMS) estimated the Gd concentration on the surface of the Gd ZnO NT/p-GaN sample to be at 0.23 at. %. The experiments demonstrated that the NTs 312 can be grown on different substrates, such as Si or sapphire, using the same growth conditions. Hence, this method is suitable for different substrates, leading to a variety of applications.

To study the role of the Gd dopants on forming the NTs 312, the inventors grew an undoped ZnO nanostructure on a p-type GaN layer using the optimized conditions discussed above. No ZnO NTs has been obtained from an undoped ZnO target, thus confirming the role of the Gd in the successful growth of vertical and hexagonal high-quality NTs 312 on the p-type GaN layer 222. Therefore, a Gd-doped ZnO target was used to form the NTs of well-defined hexagonal shape shown in FIGS. 5B and 5C, and they were subsequently utilized to fabricate UV spin-LEDs.

Figure 7:
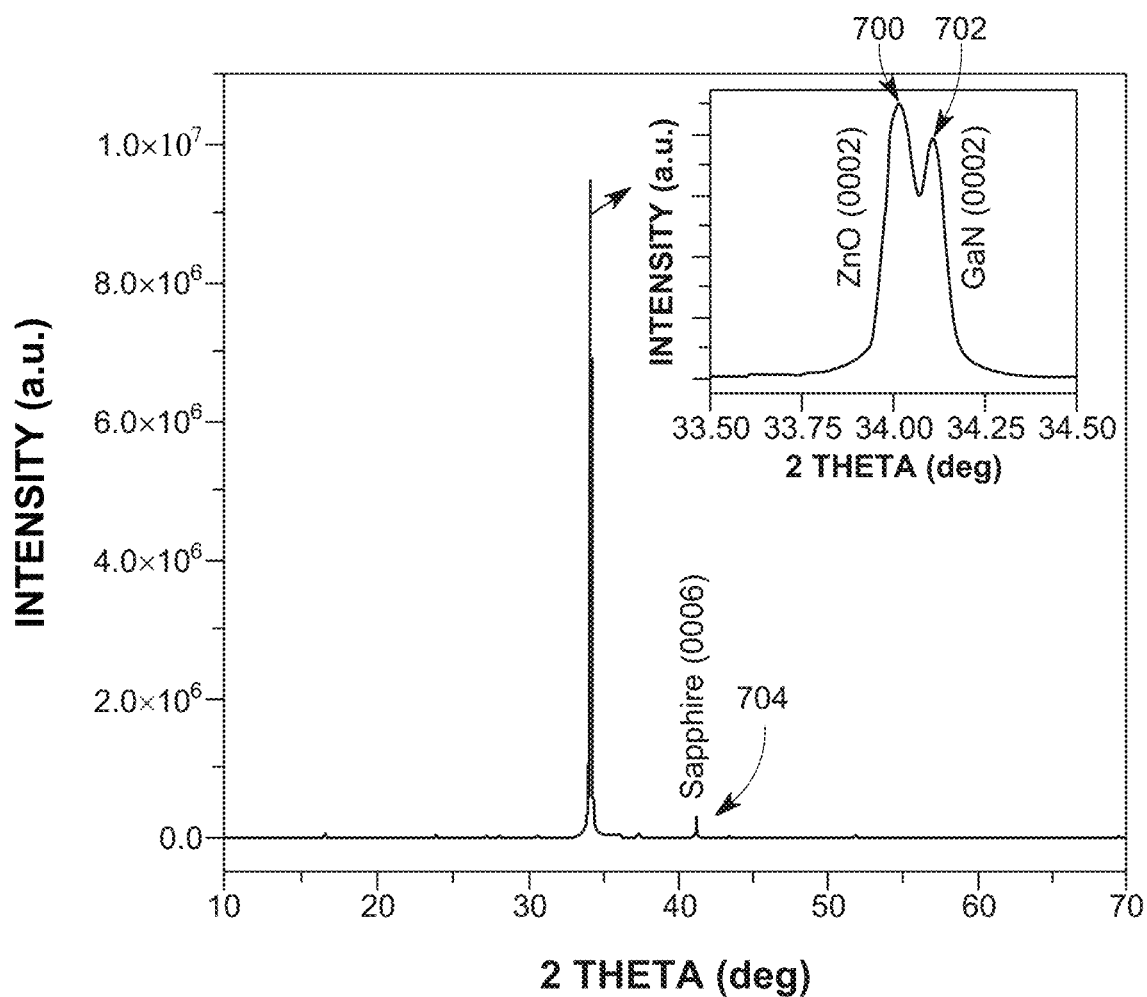
FIG. 7 illustrates the XRD pattern of n-type, Gd-doped ZnO nanotubes formed on a p-type GaN layer.

FIG. 7 shows the XRD patterns of the Gd-doped ZnO NTs 312 grown on the p-type GaN layer 222. Three well-defined peaks 700, 702, and 704 are observed in the spectrum. A first peak 700 is yielded by the ZnO NTs (34.01°) and can be attributed to the ZnO (0002) plane. The p-type GaN layer 222 produces the peak 702 at 34.11° arising from the p-type GaN (0002) plane. Finally, the peak 704 at 41.1° is due to the c-plane (0006) of the sapphire substrate. No other peaks are observed, confirming the single-crystal ZnO NT growth along the c-axis.

Figure 8A:
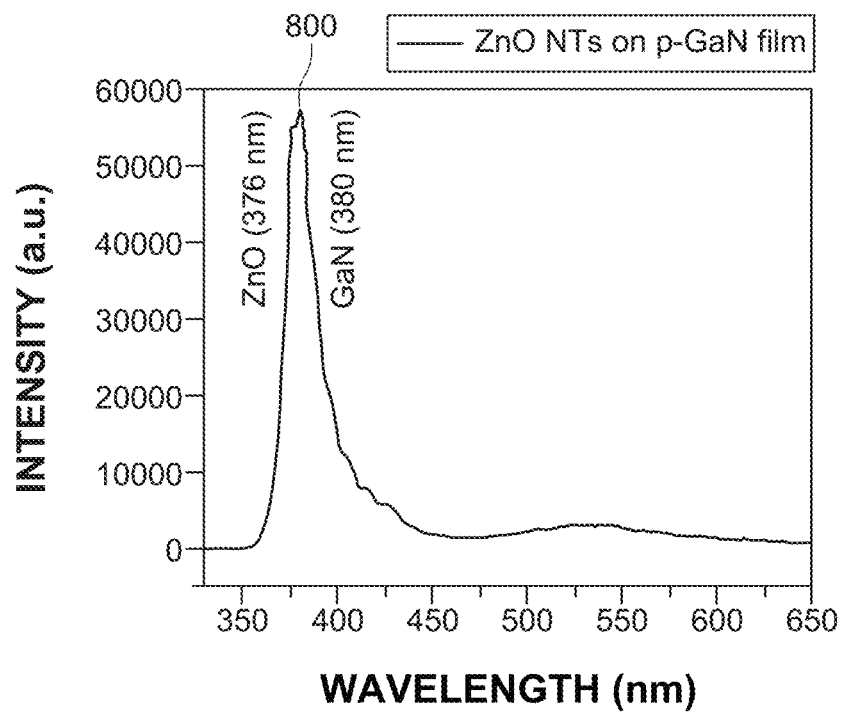
FIG. 8A illustrates the PL spectrum obtained at room temperature for the n-type, Gd-doped ZnO nanotubes.

To study the optical quality of the NTs 312 grown on the p-type GaN layer 222, TDPL (6-300 K) measurements were carried out, as shown in FIG. 8A. A sharp and intense near-band edge NBE peak 800 emerges at 3.36 and 3.25 eV at 6 K and RT. FIG. 8A shows the RT PL spectrum, which have a weak defect band o, indicating that the ZnO NTs/GaN structures exhibits high crystal quality. For comparison, the RT PL spectrum of a similar ZnO NT structure grown on sapphire (to avoid the emission from p-GaN) deposited at the same time using identical growth conditions exhibits a sharp and strong ZnO emission at 378 nm (3.25 eV) without a defect band, confirming that the defect band can be due to the GaN layer.

Figure 8B:
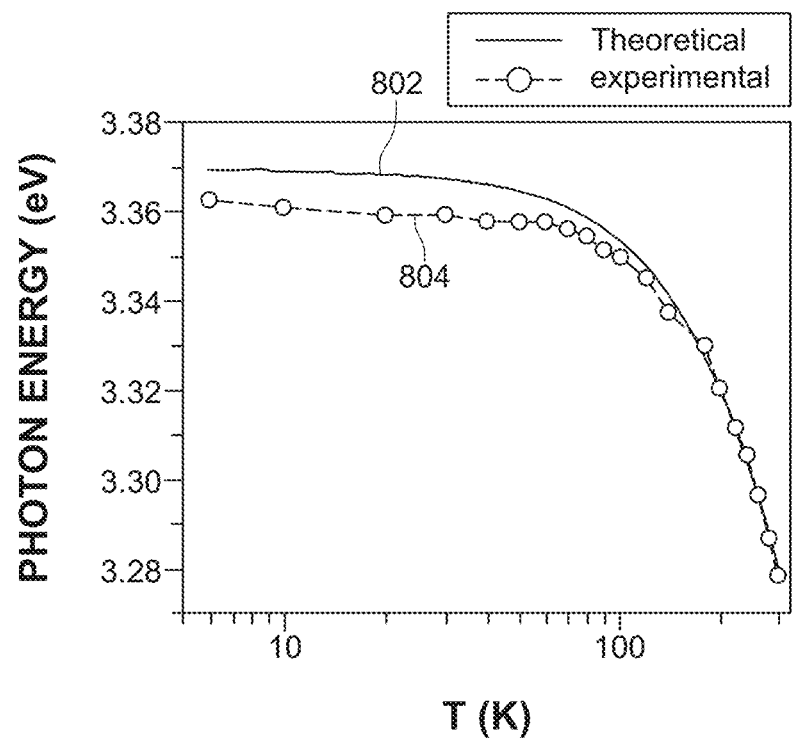
FIG. 8B shows the TDPL measurements of photon energies as a function of temperature for the n-type, Gd-doped ZnO nanotubes formed on the p-type GaN layer.
Figure 8C:
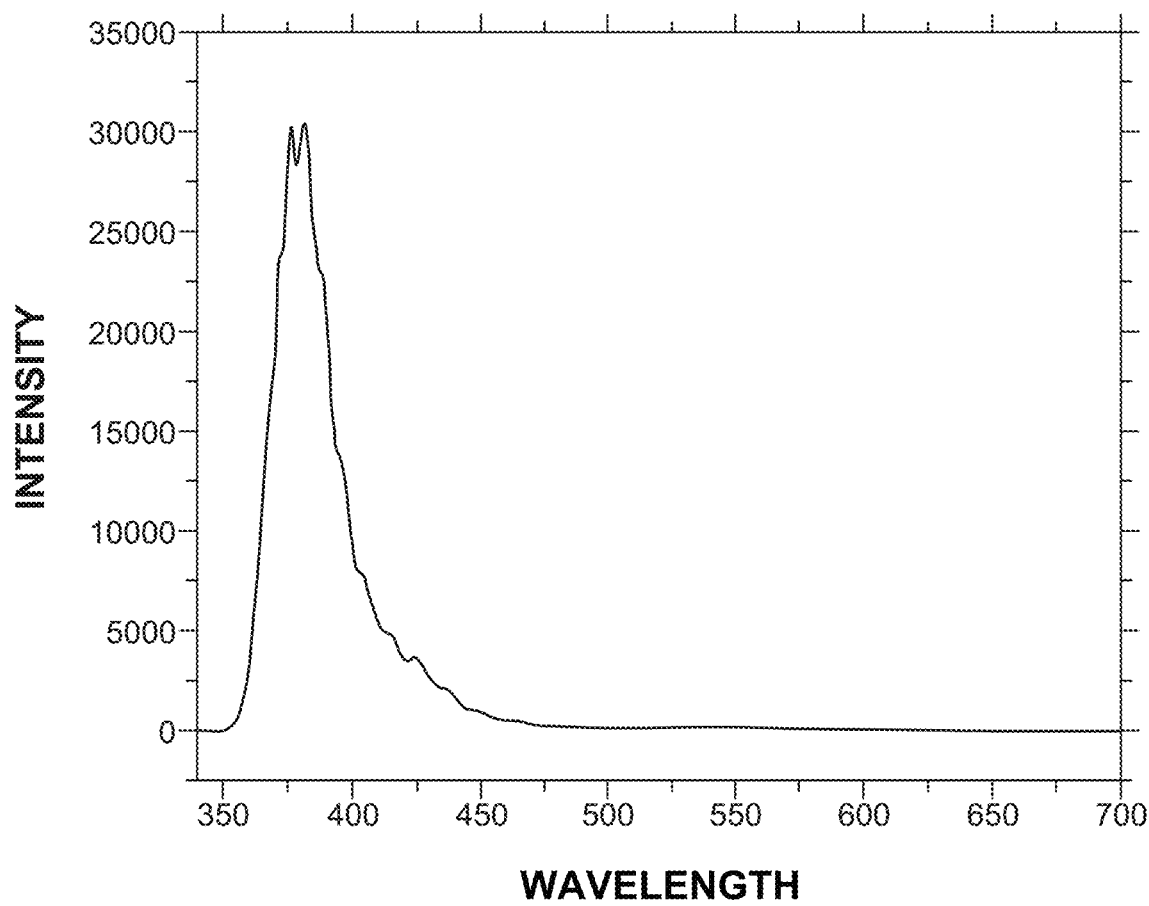
FIG. 8C shows PL spectrum obtained for n-type, Gd-doped ZnO nanofilm.

As the temperature increases from 6 K to RT, the NBE emission exhibits a slight redshift. To explain this phenomenon, the contributions of free and bound excitons should be correlated with the temperature. The TDPL 804 of the NBE exciton peak exhibits a deviation from the Varshni's law (a typical Varshni behavior of a free exciton is indicated by the line 802 in FIG. 8B) at low temperatures. A similar bound exciton behavior was observed in ZnO QWs, indicating that the NBE of the NTs is dominated by localized bound excitons. The localization energy of the bound excitons is around 9 meV. This result suggests carrier confinement similar to that observed in the QWs. FIG. 8C illustrates the RT TDPL spectrum of the Gd doped ZnO film on the p-type GaN layer.

Figure 9A:
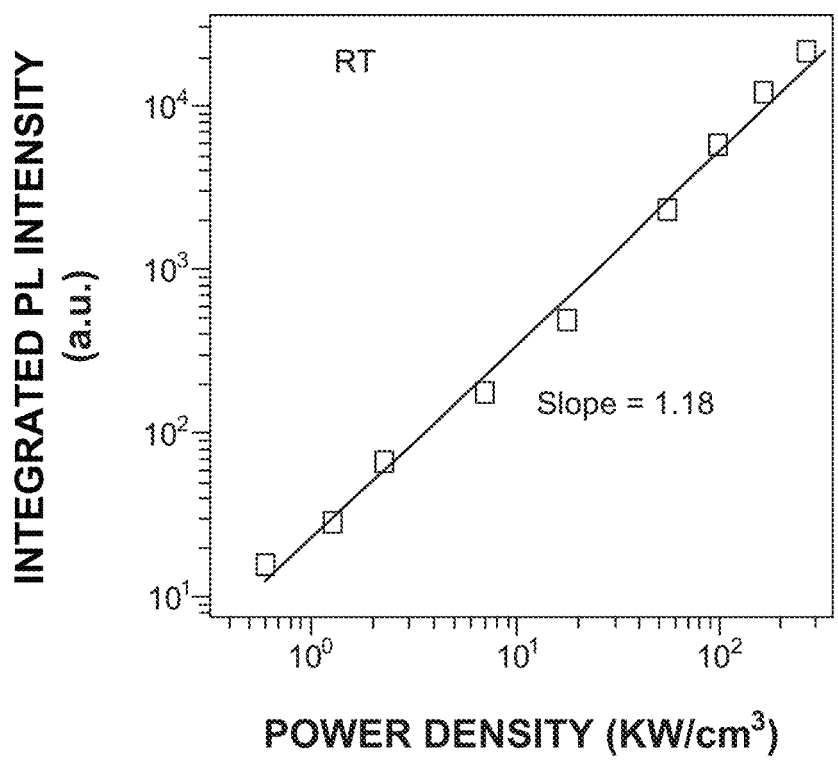
FIG. 9A illustrates the integrated PL intensity output vs. optically injected power density at room temperature (RT)
Figure 9B:
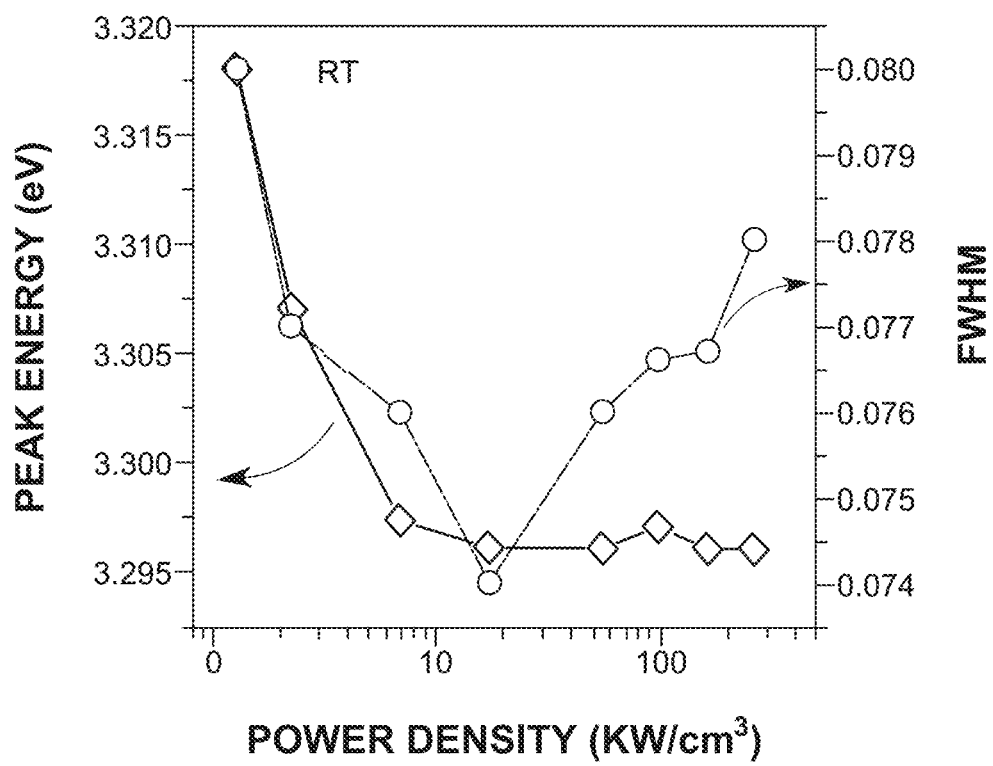
FIG. 9B illustrates the peak energy and FWHM of Gd-doped ZnO NT emission spectra as a function of optically injected power density at RT.

To understand the TDPL findings, the PDPL of the ZnO NTs grown on the p-type GaN was carried out at RT. The dependence of the integrated PL(IPL) intensity of the NBE on the excitation power (P) is defined by IPL~$P^k$, where the power factor k is positive. If the NBE emission is due to the bound-exciton radiative recombination, the k value should be in the (1<k<2) range. FIG. 9A shows the log-log plot of the IPL vs. excitation power density for the spin-LED device 200. Under low and high excitation power densities, a linear dependence of log(IPL) on log(P) is observed. The best fit is achieved at k~1.18, suggesting that the emission is due to acceptor-bound exciton recombination at RT for all considered excitation powers. The correlation shown in FIG. 9B indicates that, when the excitation power increases from 1.3 to 6.89 kW/cm$^3$ at RT, the NBE energy exhibits redshift accompanied by the peak full width at half maximum (FWHM) narrowing, which is indicative of quantum-confined Stark effect (QCSE) caused by the spontaneous and piezoelectric polarization in wurtzite ZnO. At high excitation power (P>17.2 kW/cm$^3$), the NBE energy remains roughly constant and is accompanied by peak broadening, indicating that the QCSE has been fully screened, and band state filling has taken effect, whereby the emission is dominated by radiative recombination. Consequently, the PDPL results shown in FIGS. 9A and 9B confirm the radiative recombination of bound exciton contribution in the NT emission.

Further, to confirm the high efficiency and dominant radiative recombination contribution of the spin-LED device 300, the inventors have investigated the intensity as a function of carrier density, as shown in FIG. 9A. The slope of about 1.18 in FIG. 9A confirms that, at RT, the radiative recombination dominates significantly over the entire carrier density range even at high carrier injection rates. This finding supports the observation that the radiative recombination is dominant, and is accompanied by negligible Auger recombination, confirming the high-efficiency of the obtained spin-LED structure.

Figure 10:
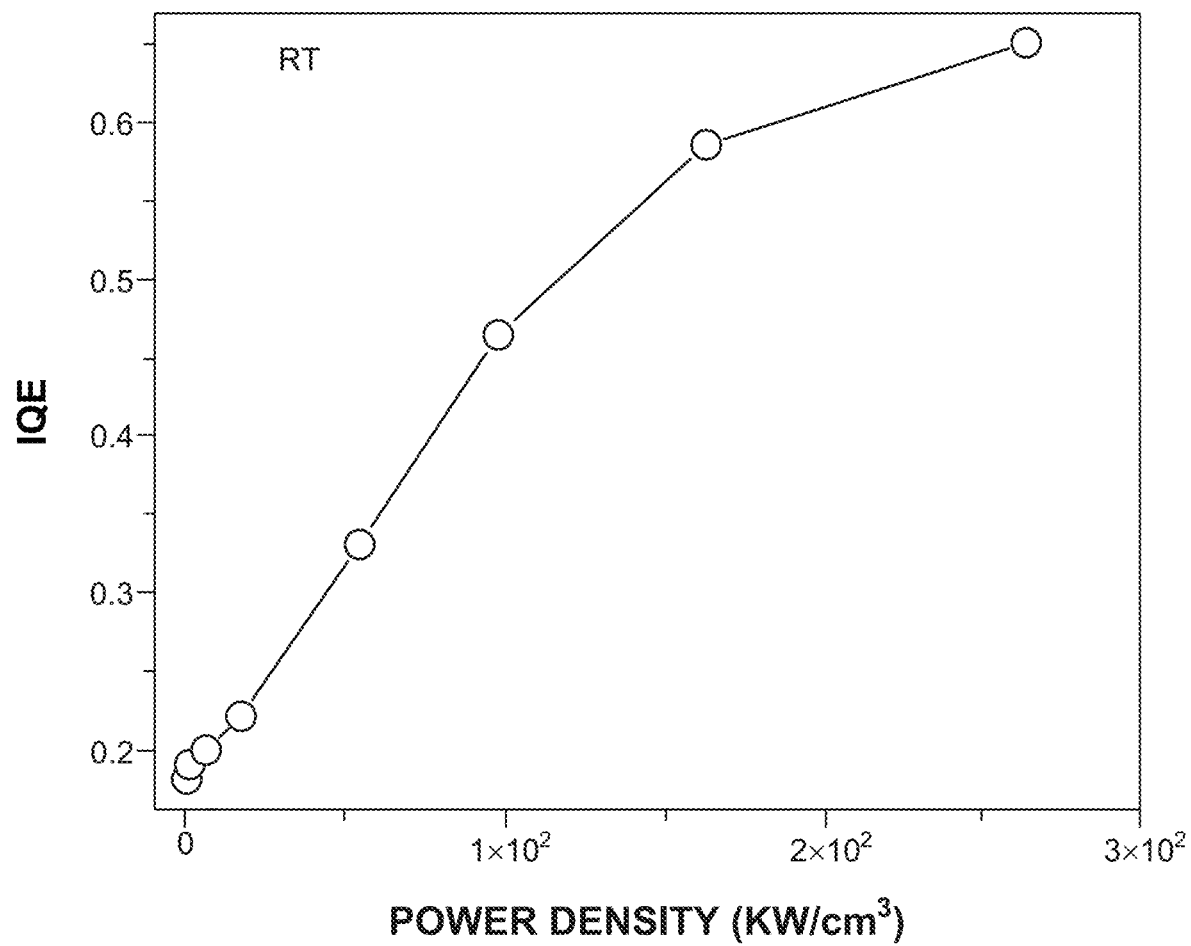
FIG. 10 illustrates the calculated IQE from the PDPL-integrated intensity at RT as a function of the excitation power density.

To investigate the carrier dynamics of the novel NTs 312, the internal quantum efficiency (IQE) correlation with the PDPL was investigated. FIG. 10 shows the IQE as a function of the power density (corresponding to the generated carrier density). The IQE was calculated by applying the ABC model to the PDPL measurement data. The plot in FIG. 10 shows that the IQE increases rapidly with the increasing excitation energy density, which can be due to the gradual saturation of the nonradiative recombination centers by generated carriers, reaching its maximum (65%) at 15.7 mW. At high carrier injection densities, the spin-LED 300 did not show $Cn^3$ behavior indicated by the ABC model, implying that the Auger recombination is insignificant.

The high binding exciton energy (60 meV), which considerably exceeds that of the GaN material (23 meV) as well as RT thermal energy (25 meV), suggests a high stability and dominance of the bound excitons that cannot be dissociated at RT, leading to a high efficiency and it is believed to be the reason of the absence of the efficiency droop as the carrier injection density increases. Thus, absence of efficiency droop confirms that the spin-LED structure 300 exhibits a high performance, as the emission is significantly denominated by the radiative recombination.

Figure 11:
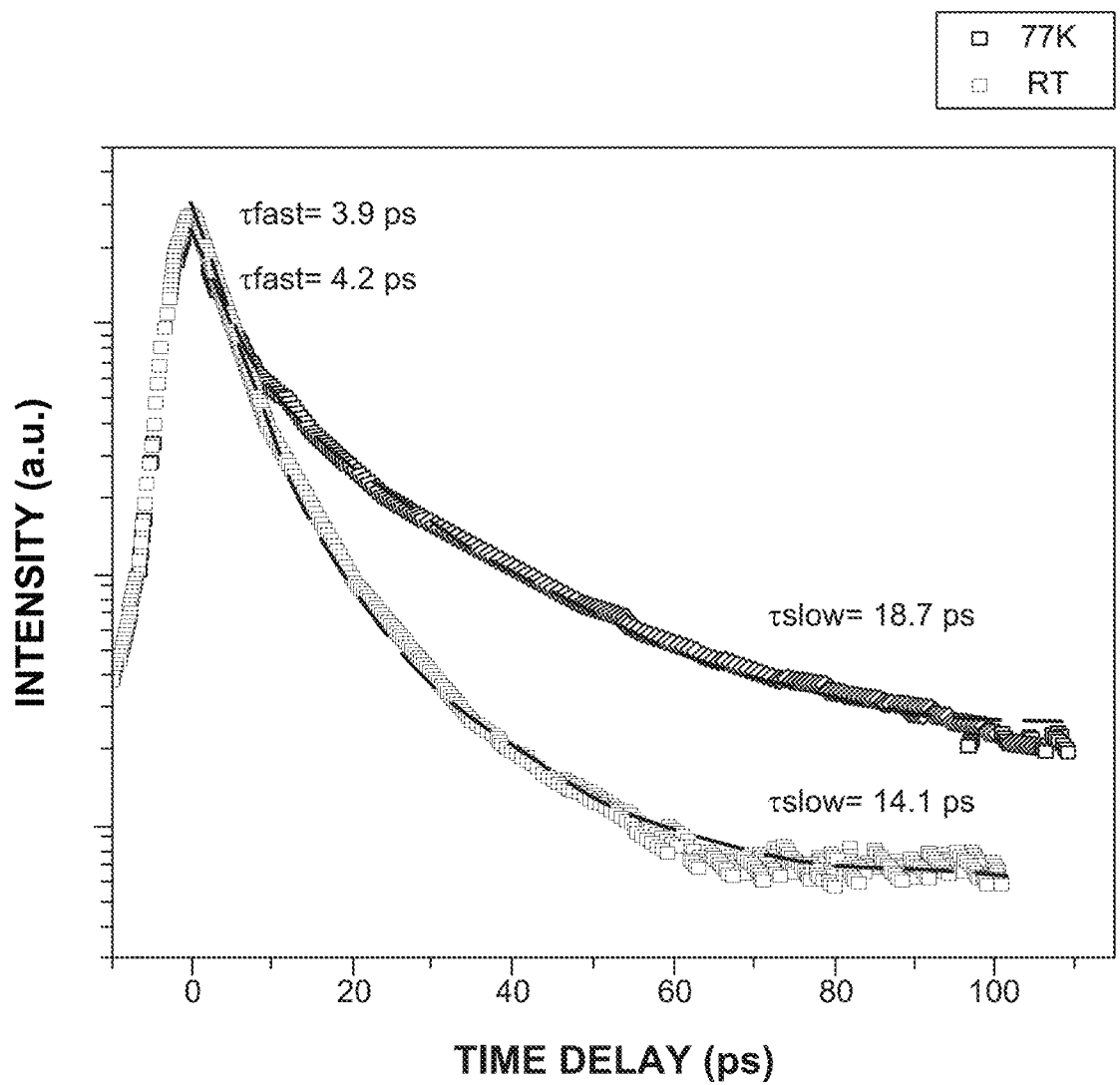
FIG. 11 shows the TRPL of the Gd-doped ZnO nanotubes at RT and 77 K with a double exponential decay fit.

The TRPL lifetimes at RT and low temperature (77 K) of the spin-LED device 300 was examined to confirm the dominant radiative recombination contribution of the UV emission. FIG. 11 shows the TRPL spectra of the Gd-doped ZnO NT 312 at the NBE peak, at low temperature, and RT. As can be seen in this figure, the TRPL decay lifetime of the sample follows a non-exponential trend at both low temperature and RT. The TRPL spectra were fitted, with excellent convergence, using the following bi-exponential decay model:

$$I_t = A_1 e^{-t/\tau_1} + A_2 e^{-t/\tau_2}$$

where $A_1$ and $A_2$ are the relative initial intensities of the fast and slow decay components, respectively, $\tau_1$ and $\tau_2$ denote the fast and slow lifetimes, respectively, and $I_t$ is the time-dependent intensity of the photoemission from the sample. As $\tau_1$ and $\tau_2$ at 77 K (RT) were 3.9 ps and 4.2 ps (18.7 ps and 14.1 ps), respectively, the results shown in FIG. 11 are in good agreement with the previously reported values for ZnO nanostructures. The fast decay, $\tau_1$, has been attributed to the effects of electron-hole scattering, inter-subband scattering ($\Delta E > \hbar\omega_{LO}$), and surface recombination states when the surface-to-volume ratio is high, whereas the slow decay, $\tau_2$, can be ascribed to the multi-excitation centers. There is a slight difference between the slow decay values, $\tau_2$, at low temperature and RT, indicating the predominance of the radiative recombination. The absence of droop and the dominance of the radiative recombination may be due to a negligible dislocation density propagating into the NTs.

Figure 12:
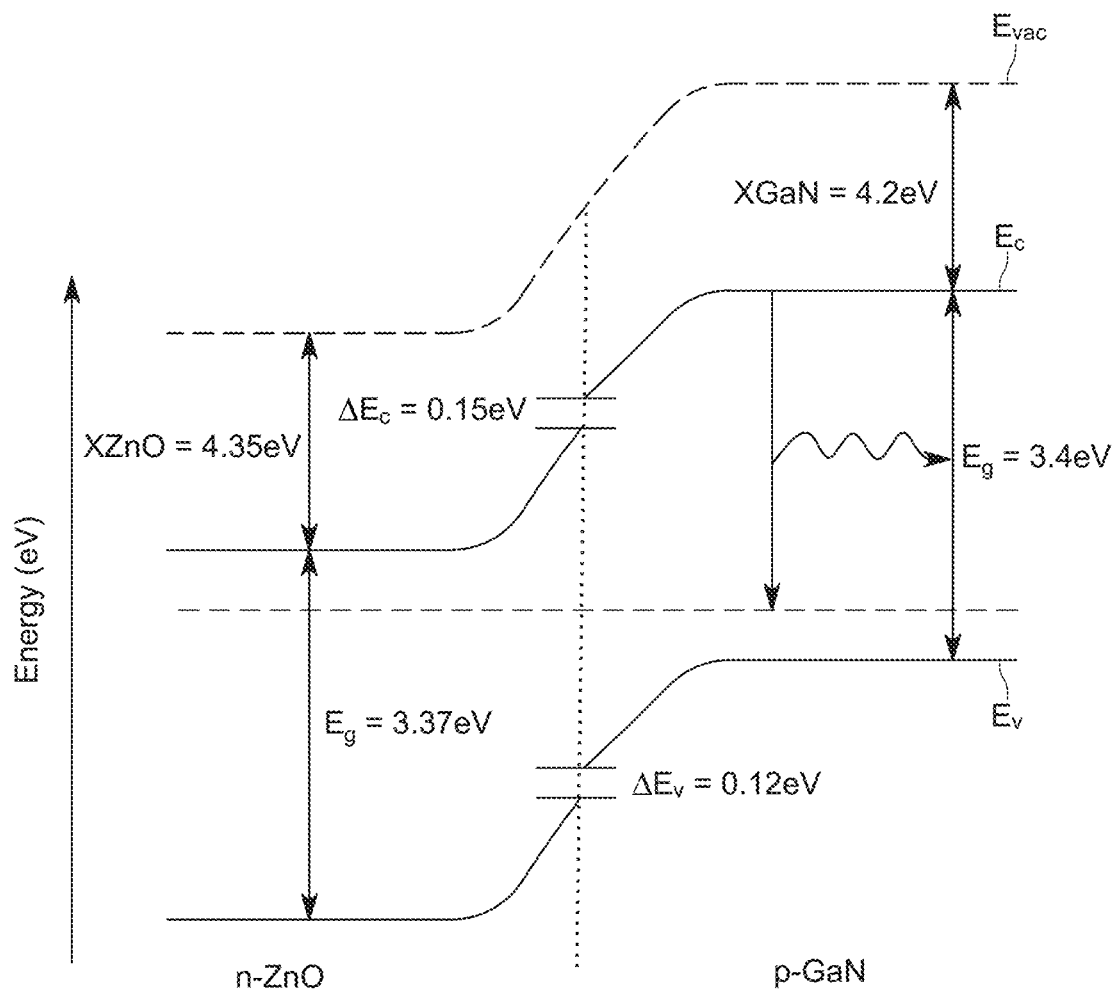
FIG. 12 shows the energy band diagram of the n-ZnO/p-GaN heterojunction without applied bias.

Other characteristics of the spin-LED device 300 are now discussed. Gd dopants in the ZnO NT were found to introduce a donor band underneath the conduction band minimum, thus increasing the n-type characteristics of the ZnO. Thus, growing the n-type Gd—ZnO NTs on the p-type Mg—GaN layer can lead to an ideal p-n junction for efficient LED devices. In this respect, it is known that efficient LED devices are formed to have a p-n heterojunction as the light emitted through the radiative recombination happens because of the electron-hole pairs formed in n- and p-layers. The p-n heterojunction mechanism can be elucidated by referring to the energy band diagram, based on the carrier diffusion process and Anderson's model, as shown in FIG. 12.

At room temperature, the n-type ZnO and p-type GaN bandgap is 3.37 eV and 3.4 eV, respectively, and the corresponding electron affinity is 4.35 eV and 4.20 eV. When the n-ZnO and p-GaN are attached, a small conduction band offset ($\Delta E_c = 0.15$ eV) and valence band offset ($\Delta E_v = 0.13$ eV) are formed. This slight band offset leads to barrier heights for electrons and holes that are practically the same, which is preferred for light emitting devices to allow high rate of electron-hole radiative recombination. Consequently, under forward bias, the holes drift from the GaN layer to the ZnO NTs, leading to electrons in the ZnO NTs to be recombined with these drifting holes, which results in the efficient UV LED emission.

Figure 13A:
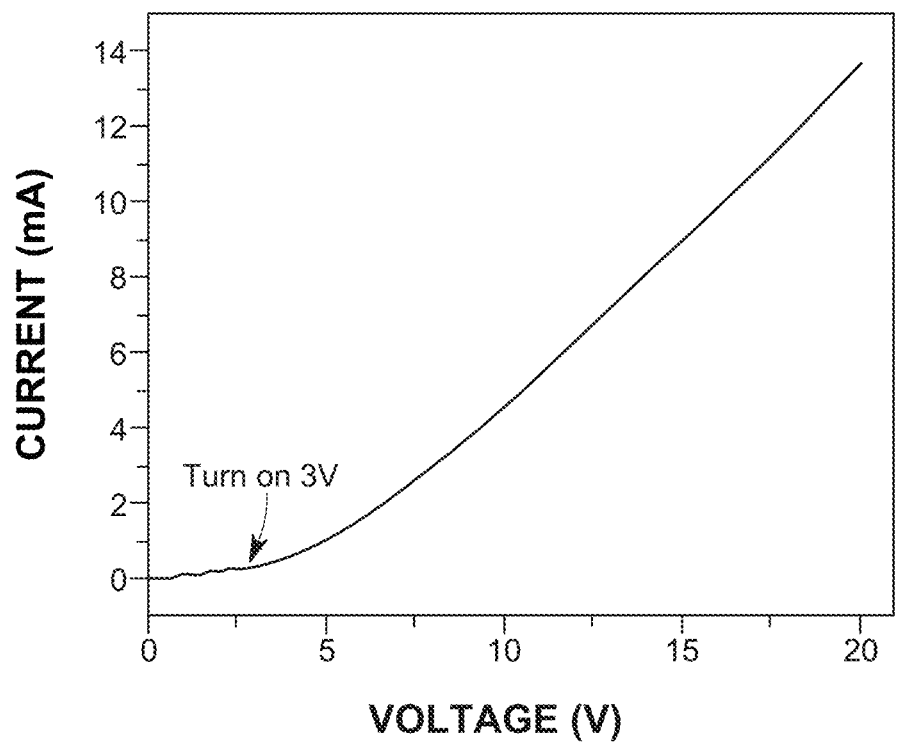
FIG. 13A shows I-V curves of Gd-doped ZnO NTs/p-GaN heterostructures.

The current-voltage (I-V) characteristics of the hybrid heterojunction Gd-doped ZnO NTs/GaN LED device 300 was measured as shown in FIG. 13A. To extract the emission from the NTs only, the free space between the individual NTs was filled with a PMMA thin layer, obtaining emission from the p-n junction between n-ZnO NTs and p-GaN. The forward bias current is nonlinear, indicating a reasonable p-n junction performance. The device junction exhibits diode properties with a turn-on forward bias voltage about 3 V. Under reverse bias above 10 V, a low leakage current ($5.6 \times 10^{-9}$ A) was measured at the junction, indicating a well-fabricated junction between the Gd-doped ZnO NTs and the metal electrode.

Figure 13B:
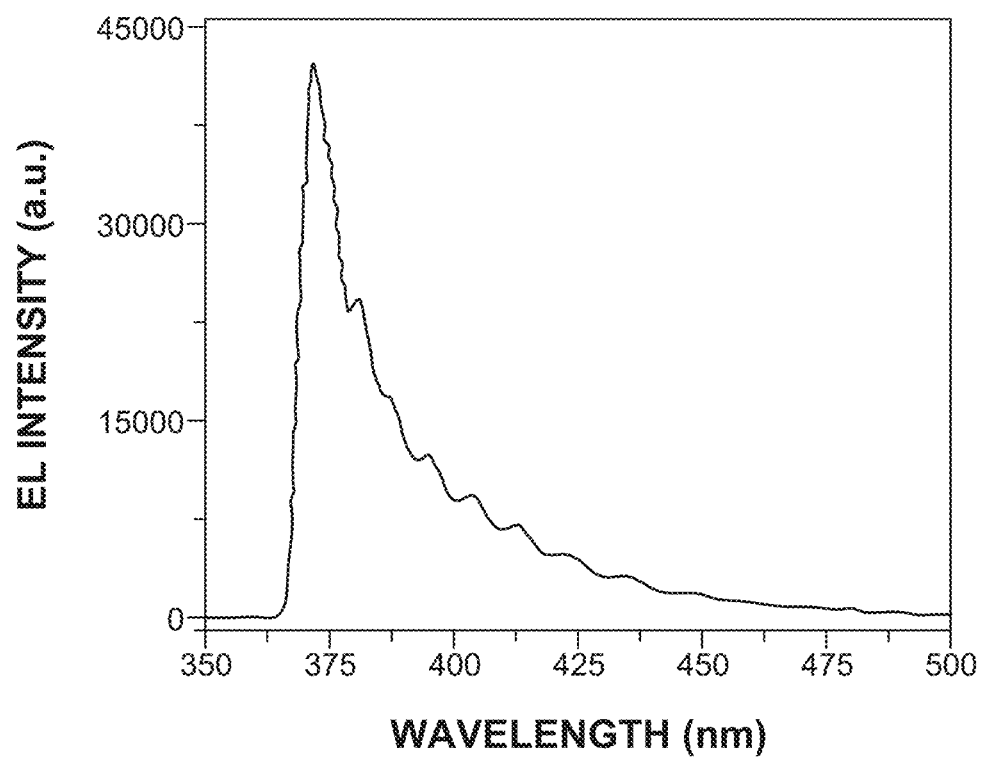
FIG. 13B shows the RT EL spectra of the LED under injection currents.

The electroluminescence (EL) spectrum of the spin-LED device 300 based on the Gd-doped ZnO NTs grown on the p-GaN layer is shown in FIG. 13B and it was measured under 120 mA forward bias current. The RT EL spectrum is characterized by a strong UV emission (371 nm) without a defect band observed in the EL spectra under different forward bias currents (2-120 mA). These results indicate a superior quality of the spin-LED device 300 when compared to UV LEDs based on ZnO films and nanostructures grown on GaN that are reported in the art [7]. In these previous studies, low UV emission was obtained, and a dominant defect band was noted in the EL spectra for ZnO/GaN devices. Thus, the results obtained for the spin-LED device 300 demonstrate that high-efficiency LED devices based on NT structures can be obtained.

The broad blue peak in the EL spectra is attributed to the donor-acceptor pair (DAP) emission, whereas the oscillations observed in the reflectivity spectrum are due to interference fringes between the reflections from the sapphire/GaN film/ZnO wetting layer interface. Similar UV emission with DAP characteristics from LEDs based on GaN/AlGaN quantum well, as well as ZnO/GaN films, was reported in pertinent literature. The blue emission is due to DAP as the p-type GaN films contain a high density of acceptors, whereas donors are introduced to the ZnO NTs 312 through the Gd dopants.

Figure 13C:
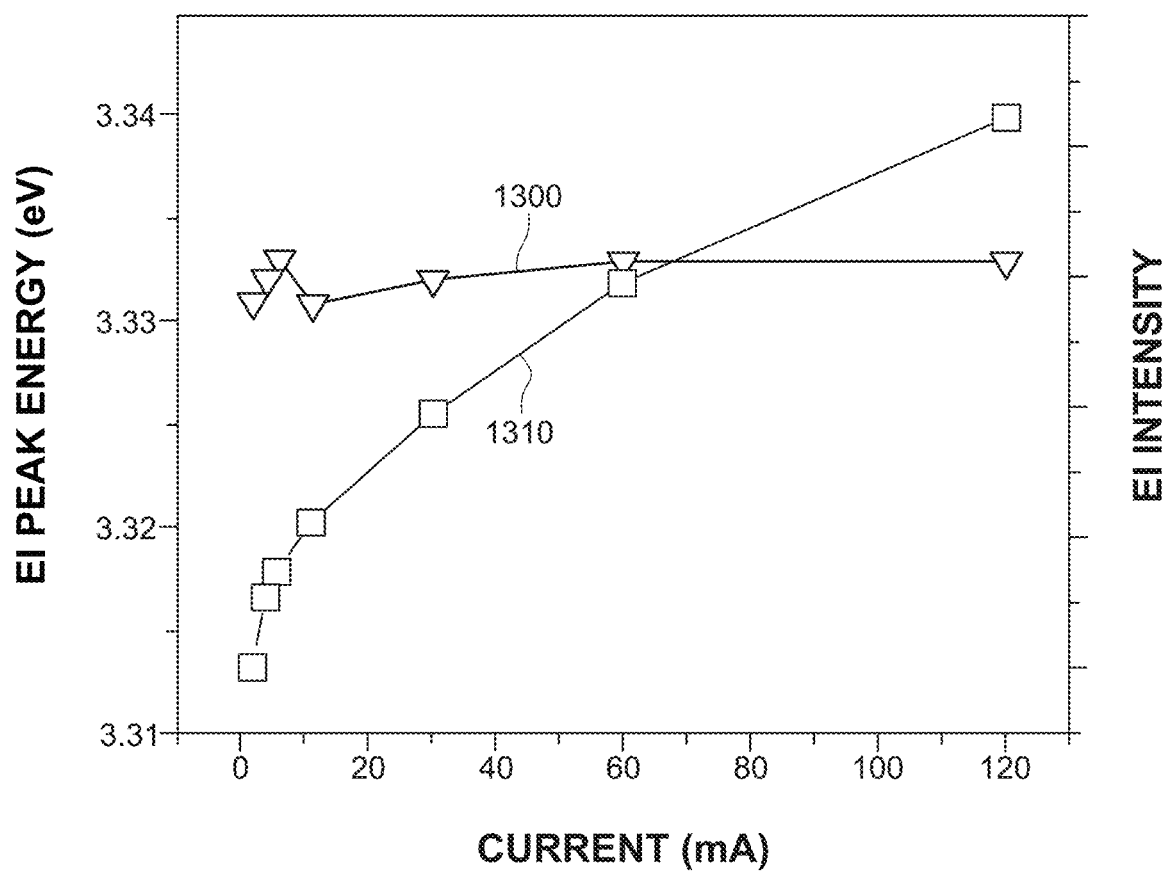
FIG. 13C shows the EL intensity and EL peak energy as a function of injection current for the LED device.

FIG. 13C shows the EL peak intensity 1300 and the peak energy 1310 as a function of the injected current, indicating that the later increases with the applied current, whereas the former remains relatively constant (~3.33 eV). The constant peak energy behavior can be attributed to a negligible QCSE at high injected power density, which is consistent with the PDPL findings. In addition, such behavior can be ascribed to the contributions of the localized bound excitons resulting from the high binding energy of the ZnO bound excitons (60 meV > 25 meV at RT).

Figure 14:
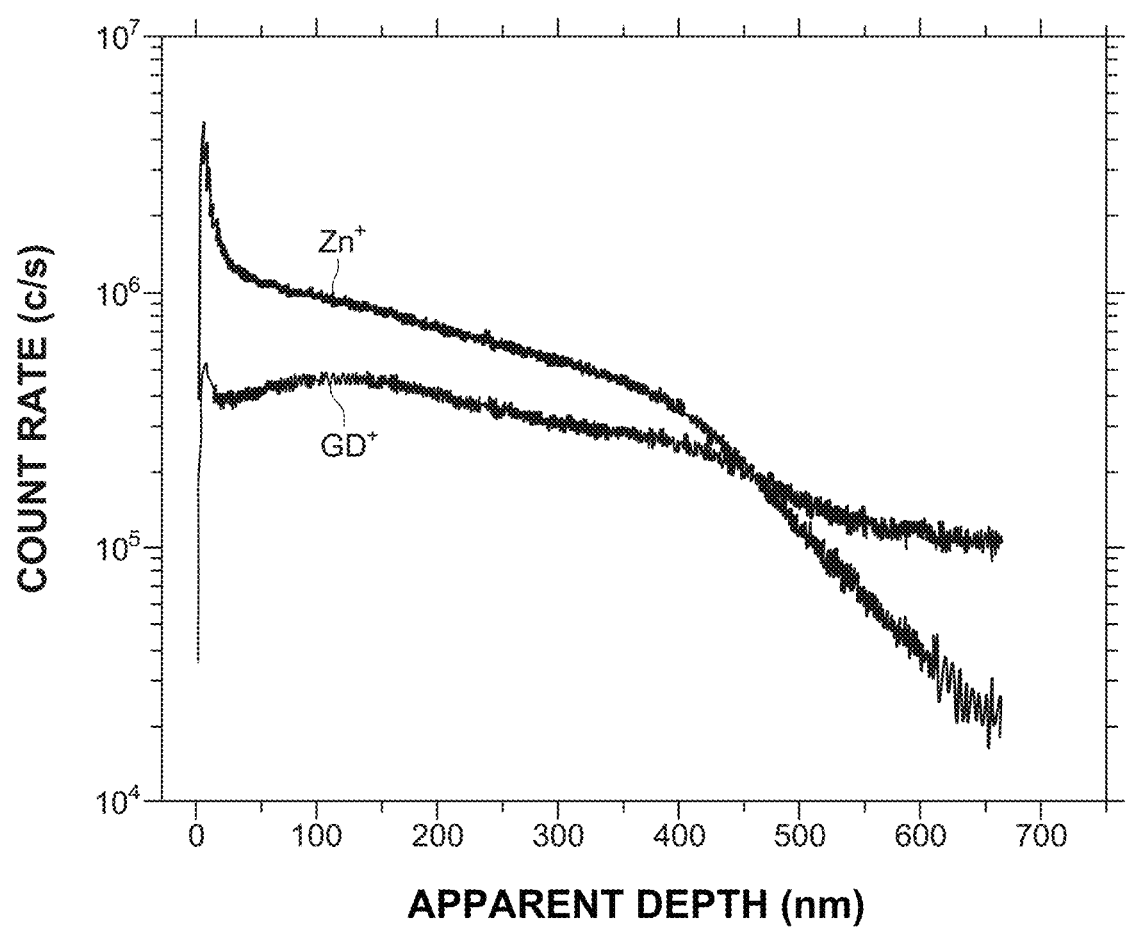
FIG. 14 shows a depth profile of the Gd concentration in the Gd-doped ZnO NTs/p-GaN heterostructures.

The depth profiling of the Gd doped ZnO NT 312 and the p-type GaN 222 based device 300 was determined using the D-secondary-ion mass spectroscopy (D-SIMS) technique and it is displayed in FIG. 14. It can be seen that, following the rapid increase in the Zn+ and Gd+ signals at the beginning of the sputtering process, probably due to a pronounced oxidation of the extreme surface, the Gd ions emit a steady signal, suggesting that the Gd atoms are distributed across the entire ZnO layer, including the NT. The Gd concentration on the surface of the Gd doped ZnO NT/p-GaN device 300 was estimated at 0.23 at. %.

Figure 15:
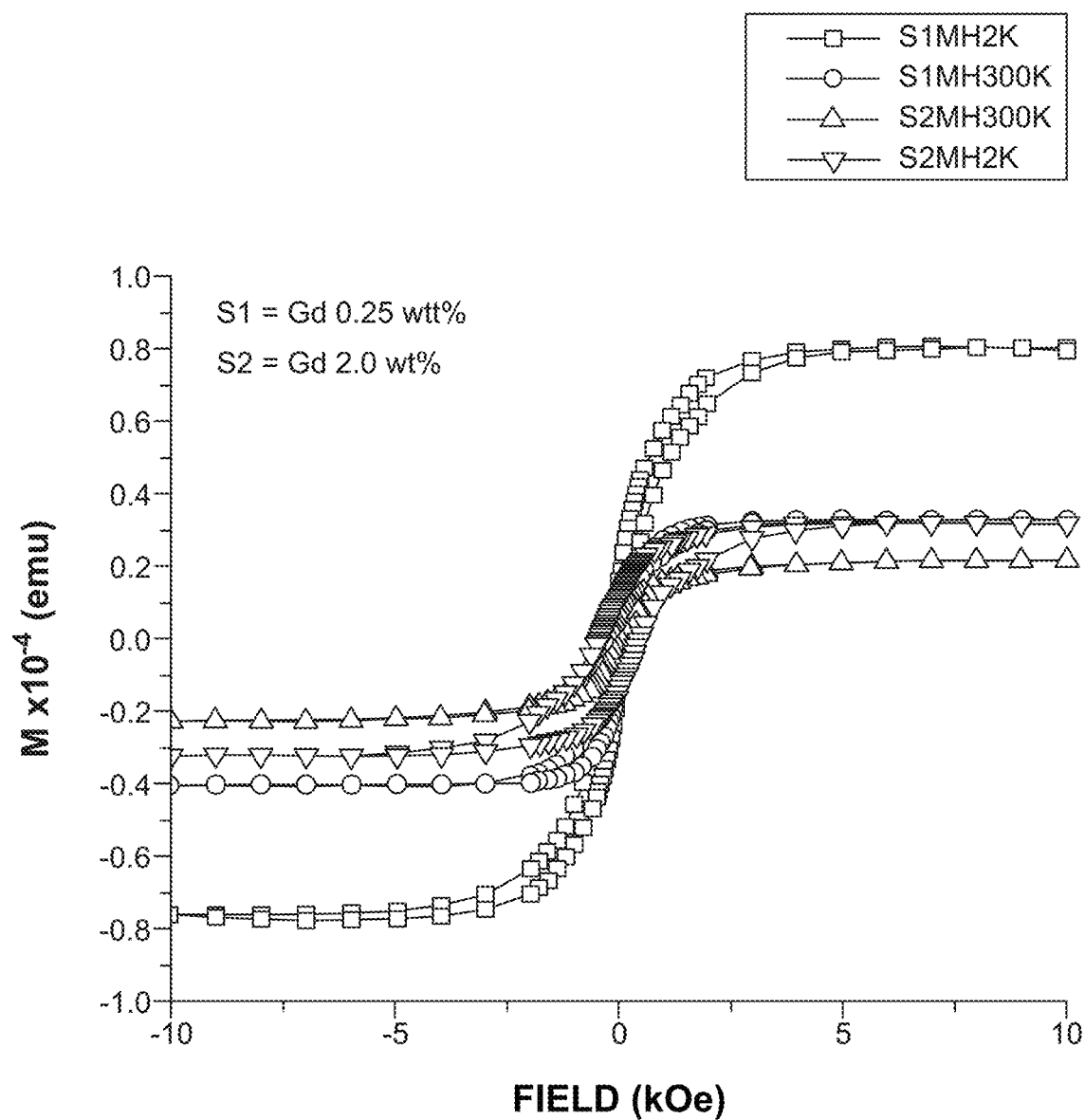
FIG. 15 shows the magneto-hysteresis (M-H) loop of the Gd-doped ZnO NTs/p-GaN heterostructure at low temperature and room temperature indicating strong ferromagnetic behavior.
Figure 16:
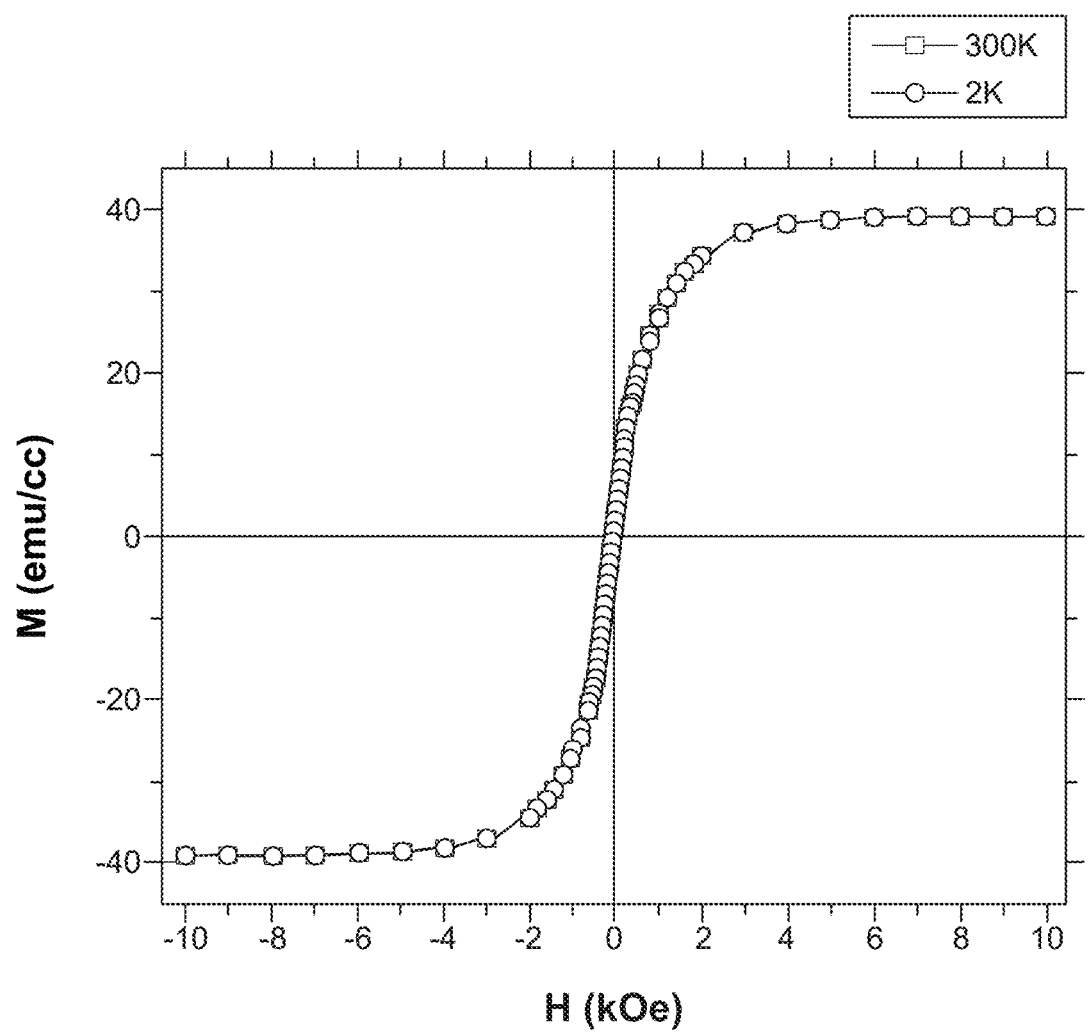
FIG. 16 shows the M-H loop of the Gd-doped ZnO NTs/p-GaN heterostructure at room temperature in emu per volume units.

The ferromagnetism of the Gd-doped ZnO films grown on $Al_2O_3$ (deposited at low oxygen pressure, <25 mTorr) is known. The inventors have also confirmed the ferromagnetic properties of the n-type Gd doped ZnO NT on the p-type GaN LED device 300 via SQUID measurements. The measurements performed by the inventors revealed the ferromagnetic loop from the n-GdZnO/p-GaN film-based LED 200, as shown in FIG. 15. The loop demonstrates a good magnetic remanence and a clear magnetic saturation, indicating a strong ferromagnetic signal at temperatures exceeding RT with good remanence coercivity values. FIG. 16 show the ferromagnetic loop in emu/cc as the thickness of the samples has been considered, indicating the magnetic saturation is high (about 40 emu/cc). This finding confirms that the emission from the diode can be associated with a circular spin due to the magnetization of the ZnO matrix.

Although the above embodiments have been discussed with regard to Gd doped ZnO nanostructures deposited on a p-type GaN substrate, other rare earth elements and/or transition metals may be used as dopants for wide bandgap semiconductors that emit UV and deep UV light, for example, GaN, ZnO, MnO, $Ga_2O_3$, AlGaN, and AlN, to produce ferromagnetic materials for UV spin-LED and spin-LDs. These wide bandgap ferromagnetic materials can be in the form of nanostructures and hetero-epitaxial layers, such as quantum dots, quantum wells, nanorods, nanowires, nanotubes, two-dimensional structures, etc., and can be used as active layers for spin UV-LEDs and spin-LDs.

The devices 200 and 300 discussed above may be adapted to work as spin photodetectors (spin-PD) to convert information carried by polarized light into spin polarized electrons. The structures shown in FIGS. 2 and 3 can thus also be adopted to produce spin-PDs based on wide bandgap ferromagnetic materials or WBG-DMS materials. The resulting spin-PDs can be used to receive the signals from spin-LEDs and spin-LDs, to convert the light waves to data, where the light waves can travel long distances between the spin-LEDs and spin-LDs and the spin-PD.

The functionality of UV spin-LEDs can lead to the advancements in several fields, such as quantum information storage and transmission, coding, circular dichroism spectroscopy, ultrafast magnetic chiral synthesis in biological applications, data transfer through coded light, all-optical magnetic writing, three-dimensional displays, and quantum optical communications. They would particularly be beneficial for space and solar blind applications, as their functionality avoids visible (solar light) interference that hinders device performance in civil aviation and military applications.

Spin-LEDs can be used to send data or coded data as polarized light (whereby the data will be stored as an integral property of the transmitted light, just as it is presently done on a USB or a hard disc). As light can traverse long distances rapidly, this would lead to almost instantaneous information transfer from one point to another. UV-based devices are also essential for communication applications in which solar interference must be avoided. The information transmitted in the form of polarized light can be received by spin-PDs and the signal can be converted to information before storage or use.

The term "nanostructure" is used herein to refer to any nanostructured material, including, but not limited to, semiconductor or oxide nanorods (NRs), nanowires (NWs), nanotubes (NTs), nanoparticles (NPs), nanocrystals (NCs), or any other suitable nanostructured materials. Nanostructure may have several structural forms.

In some embodiments, the nanostructures (e.g., semiconductors or oxides) may be doped with impurities, such as aluminum (Al), rare earth elements (e.g., gadolinium (Gd)), or any other suitable element or compound. For example, Gd may be used to increase the performance of an optoelectronic device. Gd dopants increase the donor density of ZnO, as Gd increases the n-type conductivity of ZnO, leading to high electron carrier density and significant mobility and device conductivity compared to other dopants. In some embodiments, the term "nanostructure" may refer to zinc oxide nanorods (ZnO NRs), including, but not limited to, rare earth-doped ZnO NRs, such as gadolinium-doped (Gd-doped) ZnO NRs. In other embodiments, the term "nanostructure" may refer to zinc oxide nanowires (ZnO NWs), including, but not limited to, rare earth-doped ZnO NWs, such as Gd-doped ZnO NWs. A nanostructure may be fabricated, formed, deposited, or grown on a surface of a substrate using any suitable formation, deposition, or growth process or technique, such as pulsed laser deposition, magnetron sputtering, chemical vapor deposition (CVD), metal-organic chemical vapor deposition (MOCVD), plasma-enhanced chemical vapor deposition (PECVD), electrodeposition, molecular beam epitaxy (MBE), any other suitable process, or any combination thereof. In some instances, nanostructures may form arrays, clusters, or islands of nanomaterials on the surface of the substrate. In some instances, nanomaterials be fabricated, formed, deposited, or grown in the presence of an electric field to improve vertical alignment, uniformity, distribution, yield, any other suitable parameter, or any portion thereof. For example, nanostructures (e.g., NRs, NWs, NTs) may be fabricated by PECVD in the presence of a self-bias electric field between the substrate and the plasma, which may yield nanomaterials that grow along the direction of the electric field.

Figure 17:
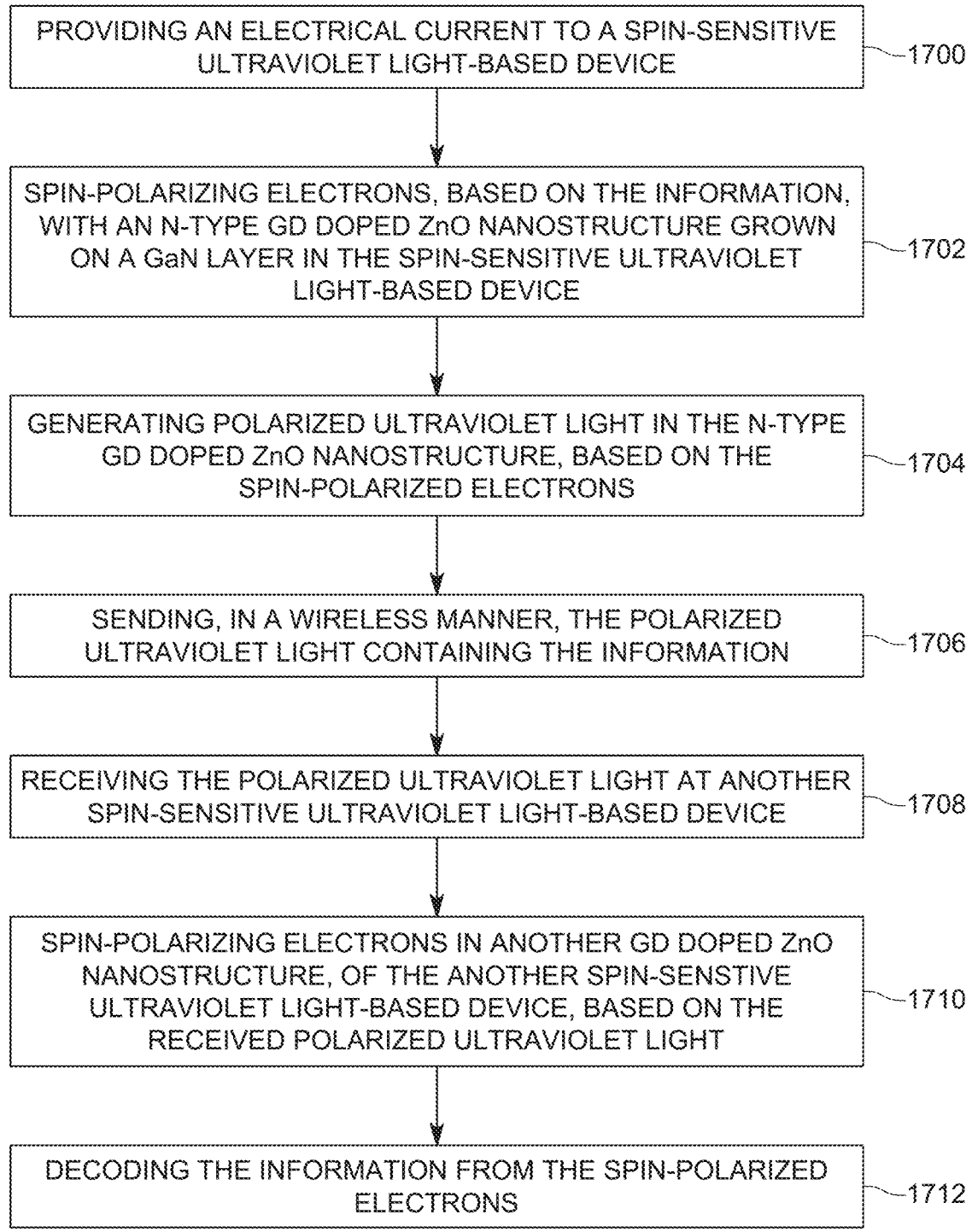
FIG. 17 is a flowchart of a method for transmitting and/or receiving information encoded or decoded based on spin-polarization of electrons.

A method for encoding/decoding information based on a spin of an electron is now discussed with regard to FIG. 17. The method includes a step 1700 of providing an electrical current to a spin-sensitive ultraviolet light-based device 300, a step 1702 of spin-polarizing electrons, based on the information, with an n-type Gd doped ZnO nanostructure 312 grown on a GaN layer 222 in the spin-sensitive ultraviolet light-based device 300, a step 1704 of generating polarized ultraviolet light 224 in the n-type Gd doped ZnO nanostructure, based on the spin-polarized electrons 212, a step 1706 of sending, in a wireless manner, the polarized ultraviolet light 224 containing the information, a step 1708 of receiving the polarized ultraviolet light at another spin-sensitive ultraviolet light-based device, a step 1710 of spin-polarizing electrons in another Gd doped ZnO nanostructure, of the another spin-sensitive ultraviolet light-based device, based on the received polarized ultraviolet light, and a step 1712 of decoding the information from the spin-polarized electrons. Note that the steps of generating the UV light based on the spin-polarization of the electrons (i.e., the encoding phase) and the steps of receiving the encoded UV light and extracting the encoded information through the spins of the electrons (i.e., the decoding phase), are performed on different devices and thus, these phases do not have to be performed simultaneously. In other words, a device may be configured to perform only one phase or both phases, i.e., a device 200 or 300 may be configured to act as a transmitter, or receive or transceiver. The steps noted above may be performed in any order. Also, not all the steps noted in FIG. 17 need to be performed by one or more devices 200 or 300.

The disclosed embodiments provide a spin-sensitive ultraviolet light-based device that is configured to encode information based on the spin of the electrons and then to send the information as polarized UV light generated based on the spin-polarized electrons, or to decode information based on the received UV polarized light, and to transfer the information from the UV light into the spin of the electrons. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] S. Chambers. Is it really intrinsic ferromagnetism? Nat. Mat. 2010; 9:956-957.
[2] P. Sharma, A. Gupta, K. V. Rao, F. J. Owens, R. Sharma, R. Ahuja, J. M. O. Guillen, B. Johansson, G. A. Gehring. Ferromagnetism above room temperature in bulk and transparent thin films of Mn-doped ZnO. Nat. Mater. 2003; 2:673-677.
[3] S. Assa Aravindh, U. Schwingenschoel and I. S. Roqan. Ferromagnetism in Gd doped ZnO nanowires: A first principles study. J. App. Phys. 2014; 116:233906.
[4] I. Bantounas, V. Singaravelu, I. S. Roqan and U. Schwingenschlogl. Structural and magnetic properties of Gd-doped ZnO. J. Mater. Chem. C. 2014; 2:10331.
[5] I. S. Roqan, S. Venkatesh, Z. Zhang, S. Hussain, I. Bantounas, J. B. Franklin, T. H. Flemban, B. Zou, J.-S. Lee, U. Schwingenschlogl, P. K. Petrov, M. P. Ryan and N. M. Alford. Obtaining strong ferromagnetism in diluted Gd-doped ZnO thin films through controlled Gd-defect complexes. J. Appl. Phys. 2015; 117:073904.
[6] S. Venkatesh, J. B. Franklin, M. P. Ryan, J-S. Lee, Hendrik Ohldag M. A. McLachlan, N. M. Alford and I. S. Roqan. Defect-band mediated ferromagnetism in Gd-doped ZnO thin films. J. Appl. Phys. 2015; 117:013913.
[7] Alvi, N.; Ali, S. U.; Hussain, S.; Nur, O.; Willander, M., Fabrication and Comparative Optical Characterization of n-ZnO Nanostructures (nanowalls, Nanorods, Nanoflowers And Nanotubes)/p-GaN White-Light-Emitting Diodes. Scripta Mater. 2011, 64, 697-700.

What is claimed is:

1. A spin-sensitive ultraviolet light-based device comprising:
    a p-type GaN layer;
    an n-type Gd doped ZnO nanostructure grown on the GaN layer;
    a first electrode formed on the GaN layer; and
    a second electrode formed on the Gd doped ZnO nanostructure,
    wherein electrons supplied through the first and second electrodes are spin-polarized by the Gd doped ZnO nanostructure, and
    wherein polarized ultraviolet light emitted or received by the Gd doped ZnO nanostructure is correlated with the spin-polarized electrons.

2. The device of claim 1, wherein the Gd doped ZnO nanostructure includes nanowires that extend perpendicular to a surface of the GaN layer.

3. The device of claim 1, wherein the Gd doped ZnO nanostructure includes nanotubes that extend perpendicular to a surface of the GaN layer.

4. The device of claim 1, wherein the Gd doped ZnO nanostructure includes nanorods that extend perpendicular to a surface of the GaN layer.

5. The device of claim 1, wherein the Gd doped ZnO nanostructure includes a nanolayer that extends along a surface of the GaN layer.

6. The device of claim 1, further comprising:
    a transparent thermoplastic layer formed directly over the GaN layer and fully enclosing a lower portion of the Gd doped ZnO nanostructure.

7. The device of claim 6, further comprising:
    a transparent conducting layer formed directly over the transparent thermoplastic layer and enclosing an upper portion of the Gd doped ZnO nanostructure.

8. The device of claim 1, further comprising:
    a power source configured to supply the electrons; and
    a computing device configured to encode information into the electrons by spin-polarizing the electrons according to a desired pattern and to generate the polarized ultraviolet light to carry the information.

9. The device of claim 1, further comprising:
    a power source configured to supply the electrons; and
    a computing device configured to decode information from the received polarized ultraviolet light by spin-polarizing the electrons based on the polarized ultraviolet light.

10. The device of claim 1, wherein the n-type Gd doped ZnO nanostructure includes a first Gd layer at an interface between the GaN layer and the n-type Gd doped ZnO nanostructure, and a second Gd layer within a ZnO region.

11. A spin-sensitive ultraviolet light-based device comprising:
    a p-type layer;
    an n-type rare element doped ZnO nanostructure grown on the p-type layer;
    a first electrode formed on the p-type layer; and
    a second electrode formed on the rare element doped ZnO nanostructure,
    wherein electrons supplied through the first and second electrodes are spin-polarized by the rare element doped ZnO nanostructure, and
    wherein polarized ultraviolet light emitted or received by the rare earth doped ZnO nanostructure is correlated with the spin-polarized electrons.

12. The device of claim 11, where the rare element is Gd and the p-type layer is GaN.

13. The device of claim 12, wherein the Gd doped ZnO nanostructure includes nanowires, nanorods or nanotubes that extend perpendicular to a surface of the GaN layer.

14. The device of claim 12, further comprising:
    a transparent thermoplastic layer formed directly over the GaN layer and fully enclosing a lower portion of the Gd doped ZnO nanostructure; and
    a transparent conducting layer formed directly over the transparent thermoplastic layer and enclosing an upper portion of the Gd doped ZnO nanostructure.

15. The device of claim 11, further comprising:
    a power source configured to supply the electrons; and
    a computing device configured to encode information into the electrons by spin-polarizing the electrons according to a desired pattern and to generate the polarized light to carry the information.

16. The device of claim 11, further comprising:
    a power source configured to supply the electrons; and
    a computing device configured to decode information from the received polarized light by spin-polarizing the electrons based on the polarized light.

17. The device of claim 12, wherein the n-type Gd doped ZnO nanostructure includes a first Gd layer at an interface between the GaN layer and the n-type Gd doped ZnO nanostructure, and a second Gd layer within a ZnO region.

18. A method for encoding/decoding information based on a spin of an electron, the method comprising:
    providing an electrical current to a spin-sensitive ultraviolet light-based device;
    spin-polarizing electrons, based on the information, with an n-type Gd doped ZnO nanostructure grown on a GaN layer in the spin-sensitive ultraviolet light-based device;
    generating polarized ultraviolet light in the n-type Gd doped ZnO nanostructure, based on the spin-polarized electrons; and sending, in a wireless manner, the polarized ultraviolet light containing the information.

19. The method of claim 18, further comprising:

receiving the polarized ultraviolet light at another spin-sensitive ultraviolet light-based device;

spin-polarizing electrons in another Gd doped ZnO nanostructure, of the another spin-sensitive ultraviolet light-based device, based on the received polarized ultraviolet light; and decoding the information from the spin-polarized electrons.

20. The method of claim 19, wherein the Gd doped ZnO nanostructure includes nanowires, nanorods or nanotubes that extend perpendicular to a surface of the GaN layer.

* * * * *